(12) United States Patent
Knoppert et al.

(10) Patent No.: US 10,739,826 B1
(45) Date of Patent: Aug. 11, 2020

(54) KEYBOARD DEPLOYMENT FOR MULTI-FORM FACTOR INFORMATION HANDLING SYSTEMS (IHSS)

(71) Applicant: Dell Products, L.P., Round Rock, TX (US)

(72) Inventors: Michiel Sebastiaan Emanuel Petrus Knoppert, Amsterdam (NL); Mark R. Ligameri, Santa Rosa, FL (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/374,454

(22) Filed: Apr. 3, 2019

(51) Int. Cl.
*G06F 1/16* (2006.01)
*H05K 7/14* (2006.01)
*H05K 5/02* (2006.01)

(52) U.S. Cl.
CPC .......... *G06F 1/1669* (2013.01); *G06F 1/1647* (2013.01); *G06F 1/1681* (2013.01); *H05K 5/0221* (2013.01); *H05K 5/0226* (2013.01); *H05K 7/1401* (2013.01)

(58) Field of Classification Search
CPC ..... G06F 1/1641; G06F 1/1669; G06F 1/1647
USPC .................................................... 361/679.17
See application file for complete search history.

(56) References Cited

U.S. PATENT DOCUMENTS

| | | |
|---|---|---|
| 5,739,810 A | 4/1998 | Merkel |
| 5,847,698 A | 12/1998 | Reavey et al. |
| 6,510,048 B2 | 1/2003 | Rubenson et al. |
| 6,700,773 B1 | 3/2004 | Adriaansen et al. |
| 6,922,333 B2 * | 7/2005 | Weng .................... G06F 1/1616 220/230 |
| 7,061,472 B1 | 7/2006 | Schweizer et al. |
| 7,551,428 B2 | 6/2009 | Homer et al. |
| 7,663,602 B2 | 2/2010 | Jones et al. |
| 7,990,702 B2 | 8/2011 | Tracy et al. |
| 7,991,442 B2 | 8/2011 | Kim |
| 8,310,823 B2 | 11/2012 | Stoltz |
| 8,331,098 B2 | 12/2012 | Leung |
| 8,803,816 B2 | 8/2014 | Kilpatrick, II et al. |
| 8,988,876 B2 | 3/2015 | Corbin et al. |
| 9,684,342 B2 | 6/2017 | Kim et al. |
| 9,740,237 B2 | 8/2017 | Moore et al. |
| 9,874,908 B2 | 1/2018 | Han et al. |
| 9,880,800 B1 * | 1/2018 | Knepper ............... G06F 1/1647 |
| 10,534,406 B2 * | 1/2020 | Makinen ............... G06F 1/1647 |
| 2004/0001049 A1 | 1/2004 | Oakley |
| 2006/0183505 A1 | 8/2006 | Willrich |
| 2009/0244016 A1 * | 10/2009 | Casparian ............. G06F 1/1616 345/173 |

(Continued)

OTHER PUBLICATIONS

Binary Fortress Software, "Precise Monitor Controls," 2017-2018, 2 pages, retrieved Oct. 15, 2018, available at https://www.displayfusion.com/Features/MonitorConfig/.

(Continued)

*Primary Examiner* — Anthony Q Edwards
(74) *Attorney, Agent, or Firm* — Fogarty LLP

(57) ABSTRACT

Embodiments of keyboard deployment for multi-form factor Information Handling Systems (IHSs) are described. In an embodiment, a method may include engaging an actuator of an IHS, where the IHS comprises a first display coupled to a second display via a hinge, and where a keyboard is coupled to a backside of the second display; and deploying the keyboard.

16 Claims, 34 Drawing Sheets

(56) References Cited

U.S. PATENT DOCUMENTS

| | | | | |
|---|---|---|---|---|
| 2010/0016036 | A1* | 1/2010 | Urushihara | H04M 1/0247 |
| | | | | 455/575.1 |
| 2010/0238620 | A1* | 9/2010 | Fish | G06F 1/1616 |
| | | | | 361/679.09 |
| 2010/0321275 | A1 | 12/2010 | Hinckley et al. | |
| 2011/0310580 | A1* | 12/2011 | Leung | G06F 1/1618 |
| | | | | 361/807 |
| 2013/0021735 | A1* | 1/2013 | Pu | G06F 1/1618 |
| | | | | 361/679.17 |
| 2015/0103014 | A1 | 4/2015 | Kim et al. | |
| 2017/0069299 | A1 | 3/2017 | Kwak et al. | |
| 2017/0255320 | A1 | 9/2017 | Kumar et al. | |
| 2017/0344120 | A1 | 11/2017 | Zuniga et al. | |
| 2018/0088632 | A1 | 3/2018 | Dreessen et al. | |
| 2018/0121012 | A1 | 5/2018 | Asrani | |
| 2018/0129391 | A1 | 5/2018 | Files et al. | |
| 2018/0188774 | A1 | 7/2018 | Ent et al. | |
| 2018/0232010 | A1 | 8/2018 | Kummer et al. | |
| 2018/0334835 | A1* | 11/2018 | Gault | G06F 1/1679 |
| 2019/0121399 | A1* | 4/2019 | Ku | G06F 3/023 |
| 2019/0129596 | A1* | 5/2019 | Ligameri | G06F 1/1641 |
| 2019/0379268 | A1* | 12/2019 | Adams | G03B 17/561 |

OTHER PUBLICATIONS

Microsoft, "ChangeDisplaySettingsExA function," 7 pages, retrieved Oct. 15, 2018, available at https://msdn.microsoft.com/en-us/library/dd183413(v=vs.85).aspx VS. https://docs.microsoft.com/en-us/windows/desktop/api/winuser/nf-winuser-changedisplaysettingsexa.

Microsoft, "SendKeys.Send(String) Method," 6 pages, retrieved Oct. 11, 2018, available at https://msdn.microsoft.com/en-us/library/system.windows.forms.sendkeys.send(v=vs.110).aspx.

Microsoft, "DoDragDrop function," 4 pages, retrieved Oct. 11, 2018, available at https://msdn.microsoft.com/en-us/library/windows/desktop/ms678486(v=vs.85).aspx.

Microsoft, "System Events and Mouse Messages," published May 30, 2018, 4 pages, retrieved Oct. 11, 2018, available at https://msdn.microsoft.com/en-us/library/windows/desktop/ms703320(v=vs.85).aspx.

Microsoft, "InkSystemGesture Enumeration," 3 pages, retrieved Oct. 11, 2018, available at https://msdn.microsoft.com/en-us/library/windows/desktop/ms695579(v=vs.85).aspx.

Microsoft, "GetWindowRect function," 3 pages, retrieved Oct. 11, 2018, available at https://msdn.microsoft.com/en-us/library/windows/desktop/ms633519(v=vs.85).aspx.

Microsoft, "PointerRoutedEventArgs Class," 9 pages, retrieved Oct. 11, 2018, available at https://docs.microsoft.com/en-us/uwp/api/Windows.UI.Xaml.Input.PointerRoutedEventArgs#Windows_UI_Xaml_Input_PointerRoutedEventArgs_GetCurrentPoint_Windows_UI_Xaml_UIElement.

Microsoft, "SetWindowPos function," 7 pages, retrieved Oct. 11, 2018, available at https://msdn.microsoft.com/en-us/library/windows/desktop/ms633545(v=vs.85).aspx.

Microsoft, "Time Functions," published May 30, 2018, 5 pages, retrieved Oct. 11, 2018, available at https://msdn.microsoft.com/en-us/library/windows/desktop/ms725473(v=vs.85).aspx.

Microsoft, "How Do I Detect a Window Open Event," 11 pages, retrieved Oct. 15, 2018, available at https://social.msdn.microsoft.com/Forums/vstudio/en-US/1953f400-6f1c-49e0-a63e-d724bccc7676/how-do-i-detect-a-window-open-event?forum=csharpgeneral.

Microsoft, "How Do I Maximize/Minimize Applications Programmatically in C#?," 2 pages, retrieved Oct. 15, 2018, available at https://social.msdn.microsoft.com/Forums/vstudio/en-US/9bde4870-1599-4958-9ab4-902fa98ba53a/how-do-i-maximizeminimize-applications-programmatically-in-c?forum=csharpgeneral.

Microsoft, "WinMain Entry Point," 7 pages, retrieved Oct. 15, 2018, available at https://msdn.microsoft.com/en-us/library/ms633559(vs.85).aspx.

Stack Overflow, "How Can I Split a Window in Two in Windows API," 6 pages, retrieved Oct. 15, 2018, available at https://stackoverflow.com/questions/10467112/how-can-i-split-a-window-in-two-in-windows-api.

Microsoft, "Application User Model IDs (AppUserModelIDs)," published May 30, 2018, 8 pages, retrieved Oct. 15, 2018, available at https://docs.microsoft.com/en-us/windows/desktop/shell/appids.

Microsoft, "Mouse Events in Windows Forms," published Mar. 29, 2017, 6 pages, retrieved Oct. 15, 2018, available at https://docs.microsoft.com/en-us/dotnet/framework/winforms/mouse-events-in-windows-forms.

* cited by examiner

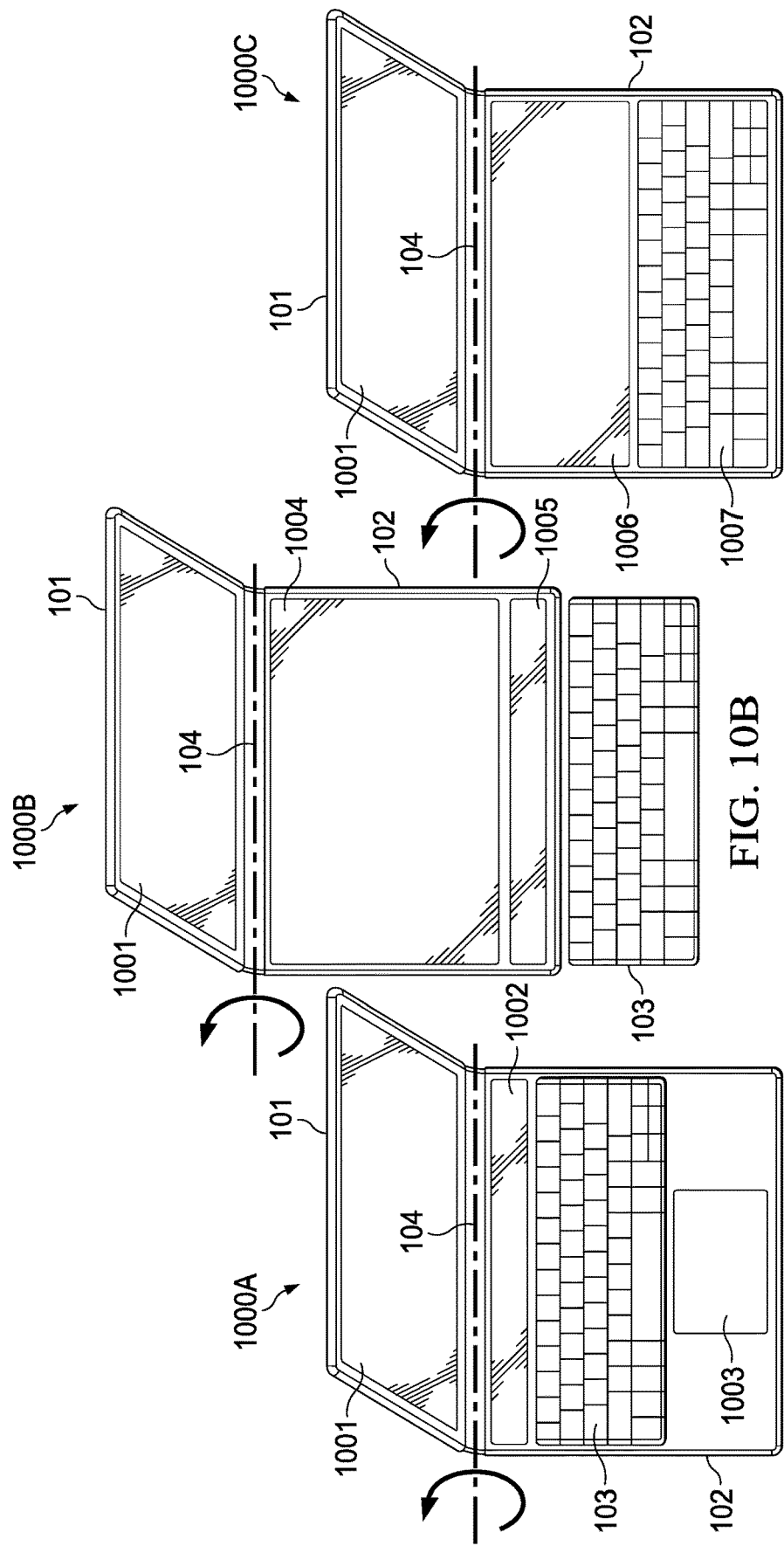

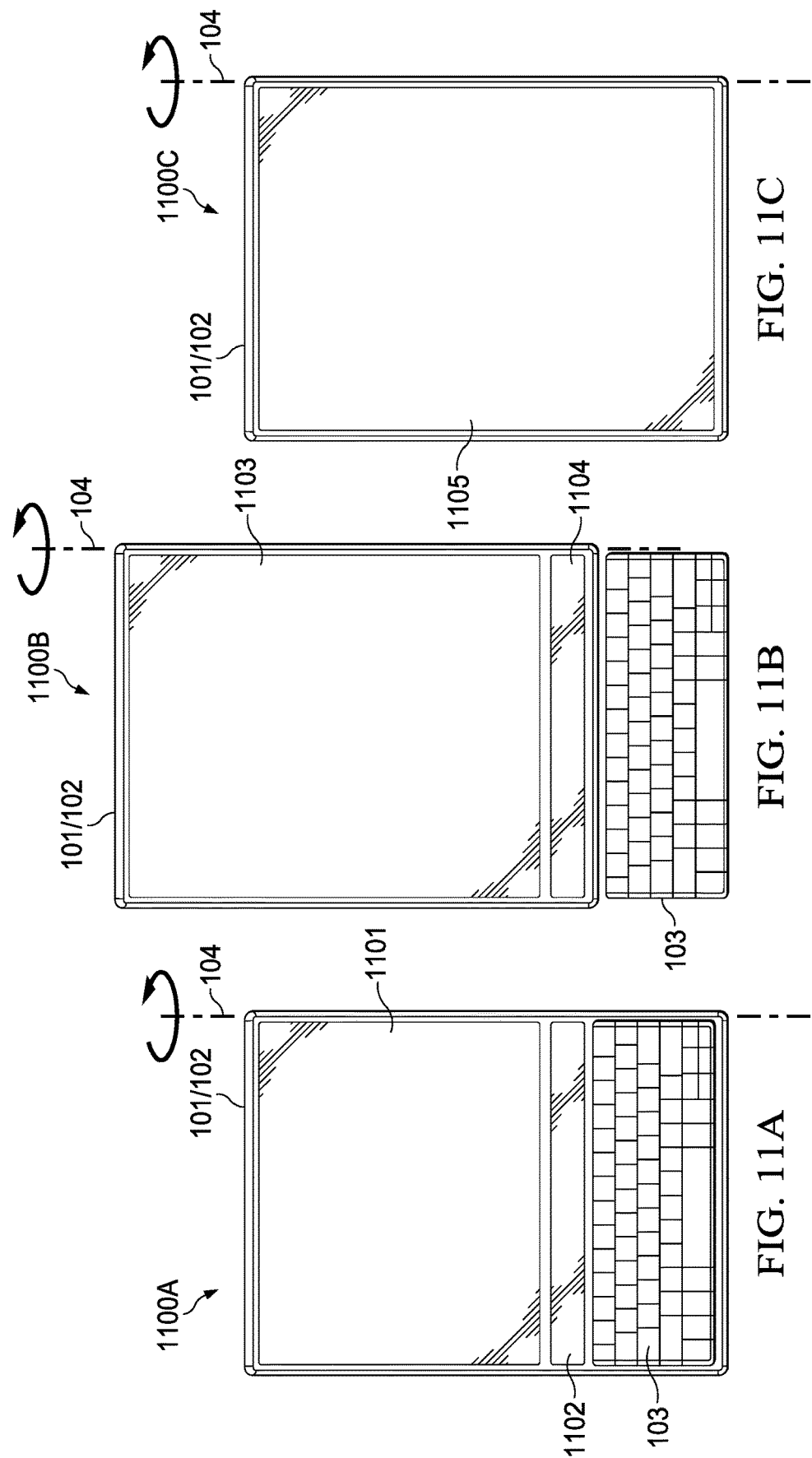

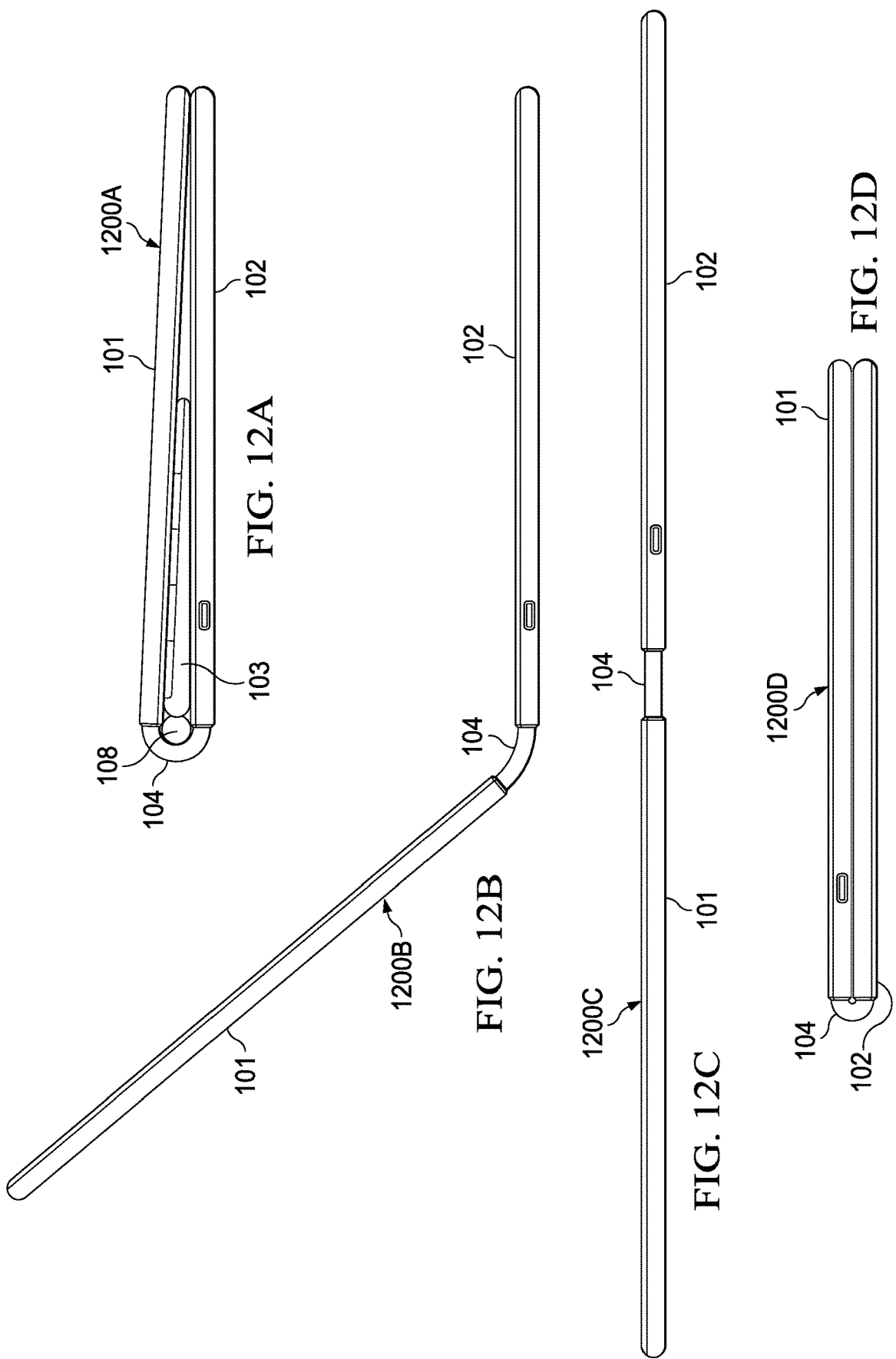

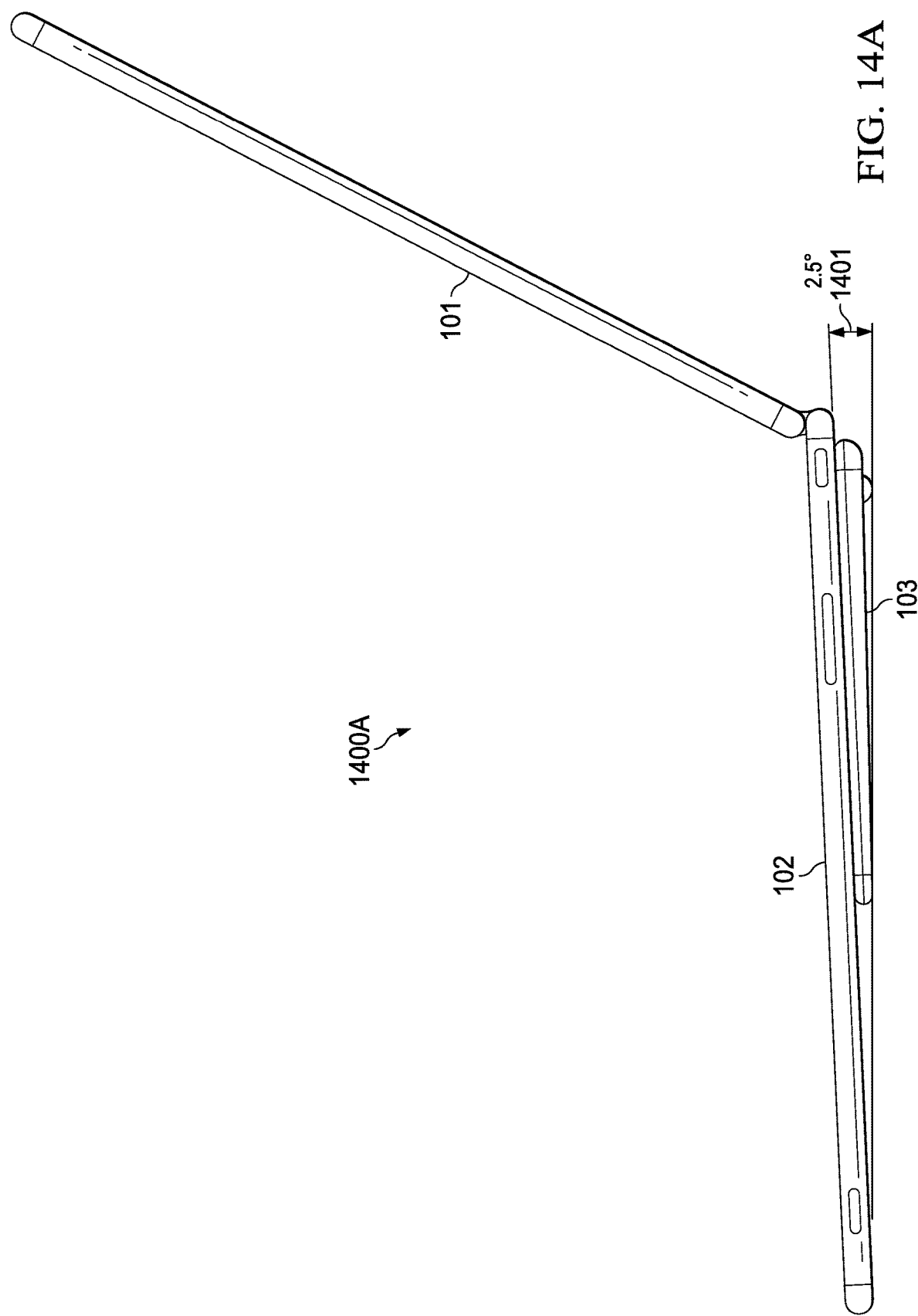

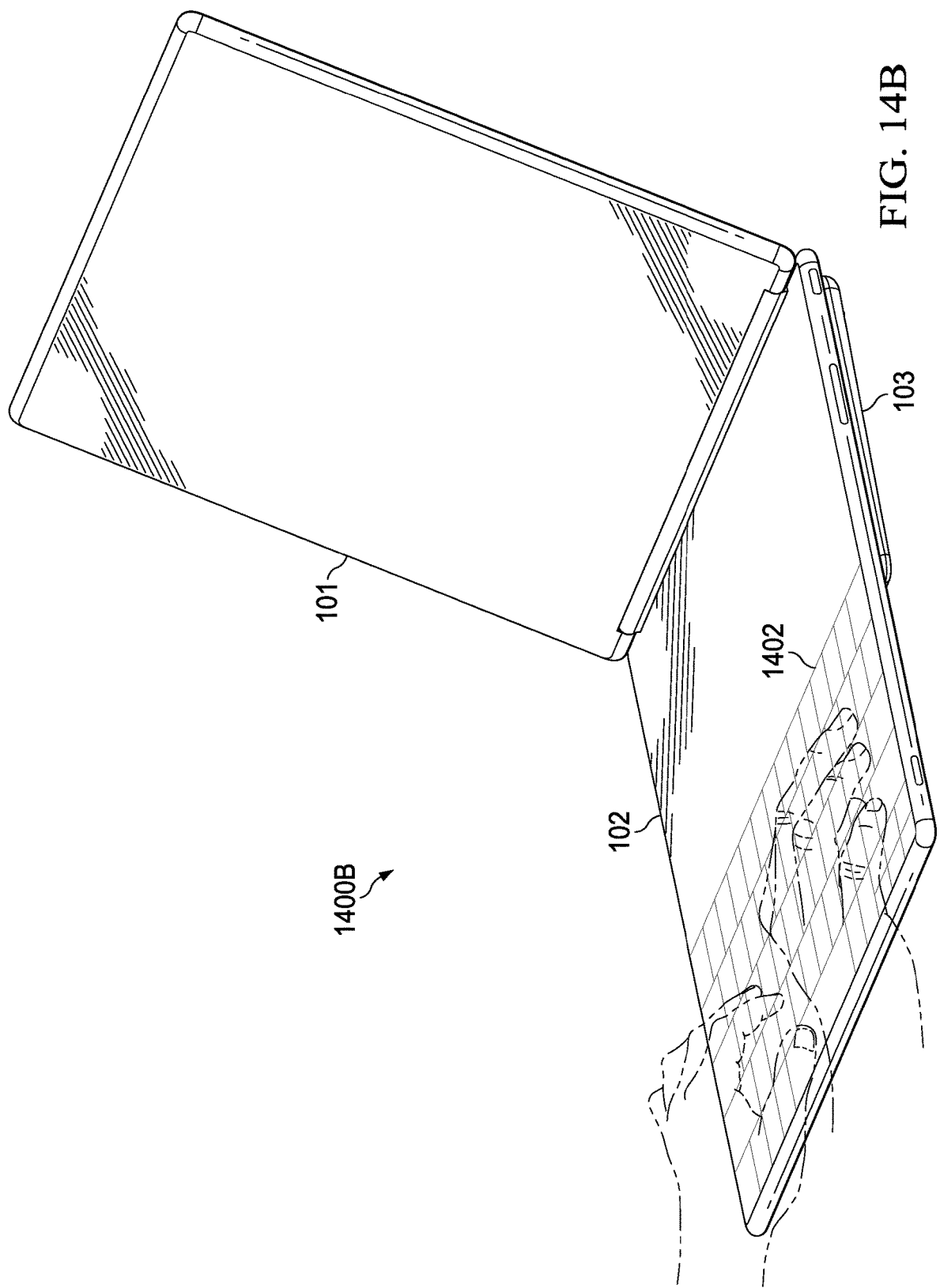

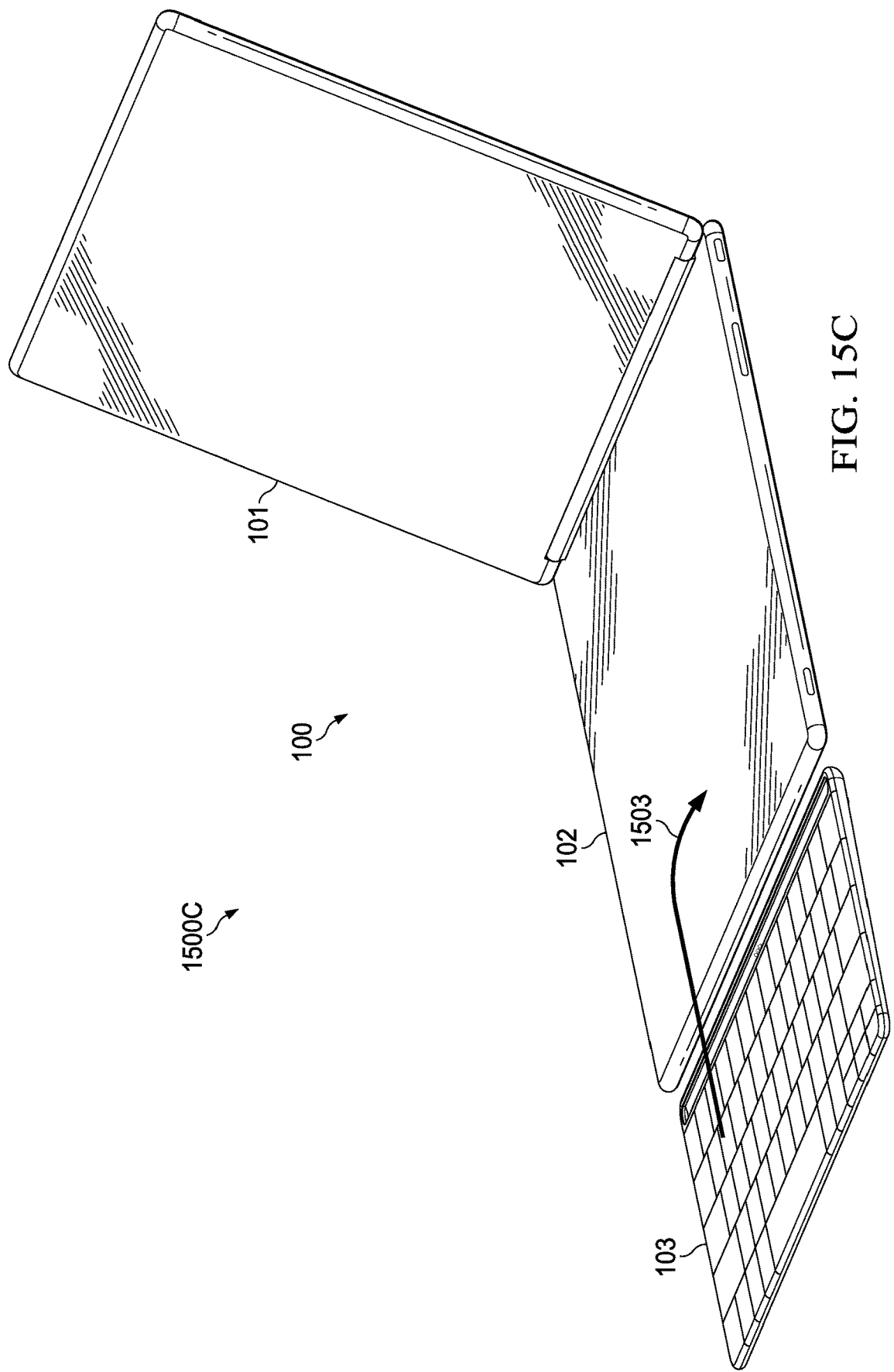

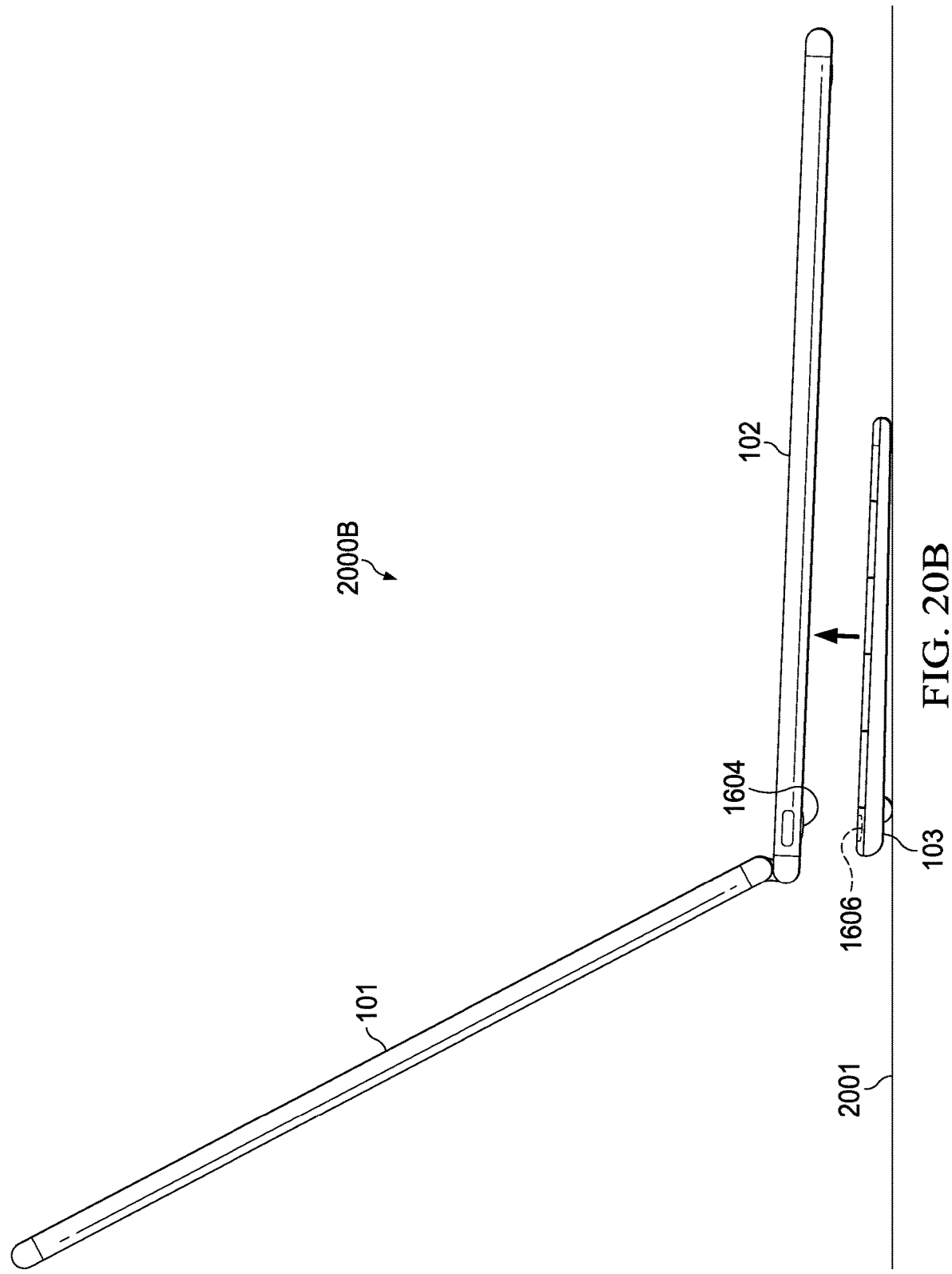

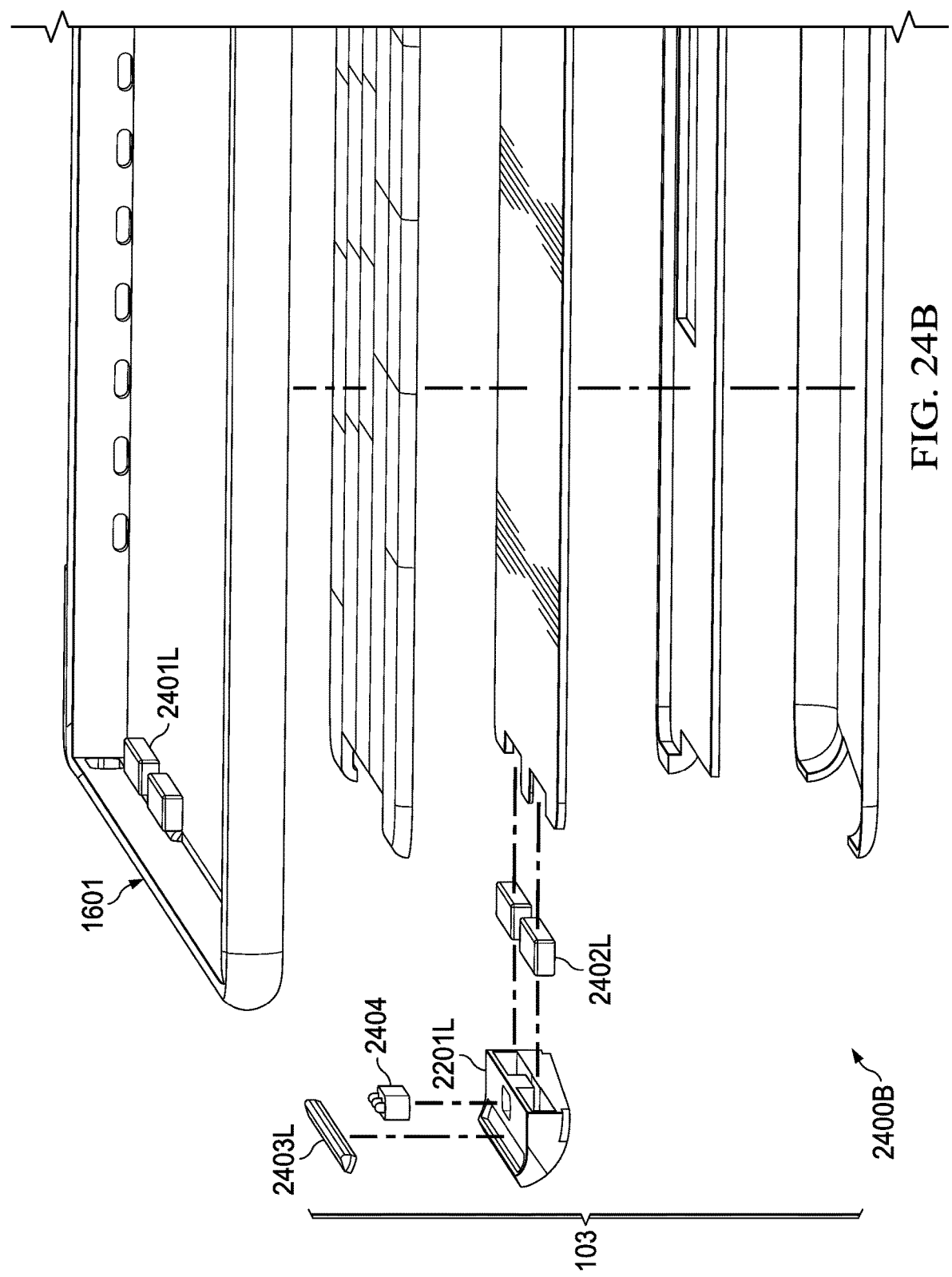

KEYBOARD DEPLOYMENT FOR MULTI-FORM FACTOR INFORMATION HANDLING SYSTEMS (IHSS)

FIELD

This disclosure relates generally to Information Handling Systems (IHSs), and more specifically, to a keyboard deployment for multi-form factor IHSs.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Nowadays, users can choose among many different types of mobile IHS devices. Each type of device (e.g., tablets, 2-in-1s, mobile workstations, notebooks, netbooks, ultrabooks, etc.) has unique portability, performance, and usability features; however, each also has its own trade-offs and limitations. For example, tablets have less compute power than notebooks and workstations, while notebooks and workstations lack the portability of tablets. A conventional 2-in-1 device combines the portability of a tablet with the performance of a notebook, but with a small display—an uncomfortable form factor in many use-cases.

The inventors hereof have determined that, as productivity continues to be a core tenet of modern computing, mobile IHS devices should provide versatility for many use-cases and display postures in use today (e.g., tablet mode, laptop mode, etc.), as well as future display postures (e.g., digital notebooks, new work surfaces, etc.). Additionally, mobile IHS devices should provide larger display area with reduced size and weight.

Summary

Embodiments of a keyboard deployment system for multi-form factor Information

Handling Systems (IHSs) are described. In an illustrative, non-limiting embodiment, a method may include engaging an actuator of an IHS, where the IHS comprises a first display coupled to a second display via a hinge, and where a keyboard is coupled to a backside of the second display; and deploying the keyboard.

For example, when the keyboard is coupled to the backside of the second display, keycaps on the keyboard may face the backside of the second display. Deploying the keyboard may include dropping the keyboard on a flat surface underneath the second display. The method may also include positioning the IHS on the flat surface, behind the keyboard, in a laptop posture. The actuator may be a button on the second display. A key on the keyboard may include a first magnet and the second display may include a second magnet aligned with the first magnet when the keyboard is coupled to the backside of the second display. For example, the key may be a space bar.

Engaging the button may cause an electrical current to be applied to a wire loop within the second display. To deploy the keyboard, contraction of the wire loop due to the electrical current may misalign a first magnet disposed within the keyboard with respect to a second magnet disposed within the second display. Misaligning the first magnet with respect to the second magnet may include swiveling a spring-loaded arm coupled to the second magnet. Additionally, or alternatively, misaligning the first magnet with respect to the second magnet may cause a spring-loaded foot that is magnetically coupled to the first magnet and mechanically coupled to a recess near a top edge of the keyboard to recede into the second display.

In some cases, the actuator may include a side wing having a rib coupled to a groove on the second display. The side wing further may include a magnet configured to become magnetically coupled to a corresponding magnet in the second display.

In another illustrative, non-limiting embodiment, an IHS may include: a first display; and a second display coupled to the first display via a hinge, where the second display comprises an actuator configured to deploy a keyboard attached to an underside of the second display. A space bar on the keyboard may include a first magnet and the second display may include a second magnet aligned with the first magnet when the keyboard is attached to the underside of the second display.

The actuator may be configured to cause an electrical current to be applied to a wire within the second display, and to deploy the keyboard, contraction of the wire due to the electrical current may misalign a first magnet disposed within the keyboard with respect to a second magnet disposed within the second display by swiveling a spring-loaded arm coupled to the second magnet. The second display may include a spring-loaded foot magnetically coupled to the first magnet and mechanically coupled to a recess near a top edge of the keyboard. The actuator may include a wing having a rib coupled to a groove on the second display, and the wing may include a magnet configured to become magnetically coupled to another magnet on the second display.

In yet another illustrative, non-limiting embodiment, a device may include a trigger mounted on a display; and a wire configured to contract in response to activation of the trigger, where the wire is coupled to a spring-loaded arm, and where the contraction translates a first magnet within the display with respect to a second magnet within a keyboard. The device may include a spring-loaded foot that, in response to the keyboard being attached to the display, becomes magnetically coupled to the first magnet and mechanically coupled to the keyboard.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

FIGS. 10A-C and 11A-C illustrate various use-cases, according to some embodiments.

FIGS. 12A-D illustrate a hinge implementation, according to some embodiments.

FIGS. 14A and 14B illustrate a multi-form factor IHS with a keyboard coupled to an underside of a display while in laptop posture, according to some embodiments.

FIGS. 15A-C illustrate a method for deploying a keyboard with an actuator, according to some embodiments.

FIGS. 20A-C illustrate a keyboard attachment operation, according to some embodiments.

FIG. 24A and 24B illustrate components of a mechanical wing system, according to some embodiments.

DETAILED DESCRIPTION

Embodiments described herein provide systems and methods for deploying a keyboard that is attachable to a multi-form factor Information Handling Systems (IHSs). In various implementations, a mobile IHS device may include a dual-display, foldable IHS. Each display may include, for example, a Liquid Crystal Display (LCD), Organic Light-Emitting Diode (OLED), or Active Matrix OLED (AMO-LED) panel or film, equipped with a touchscreen configured to receive touch inputs. The dual-display, foldable IHS may be configured by a user in any of a number of display postures, including, but not limited to: laptop, tablet, book, clipboard, stand, tent, and/or display.

A user may operate the dual-display, foldable IHS in various modes using a virtual, On-Screen Keyboard (OSK), or a removable, physical keyboard. In some use cases, a physical keyboard may be placed atop at least one of the screens to enable use of the IHS as a laptop, with additional User Interface (UI) features (e.g., virtual keys, touch input areas, etc.) made available via the underlying display, around the keyboard. In other use cases, the physical keyboard may be placed in front of the IHS to expose a larger display area. The user may also rotate the dual-display, foldable IHS, to further enable different modalities with the use of the physical keyboard. In some cases, when not in use, the physical keyboard may be placed or stored inside the dual-display, foldable IHS.

Figure 1:
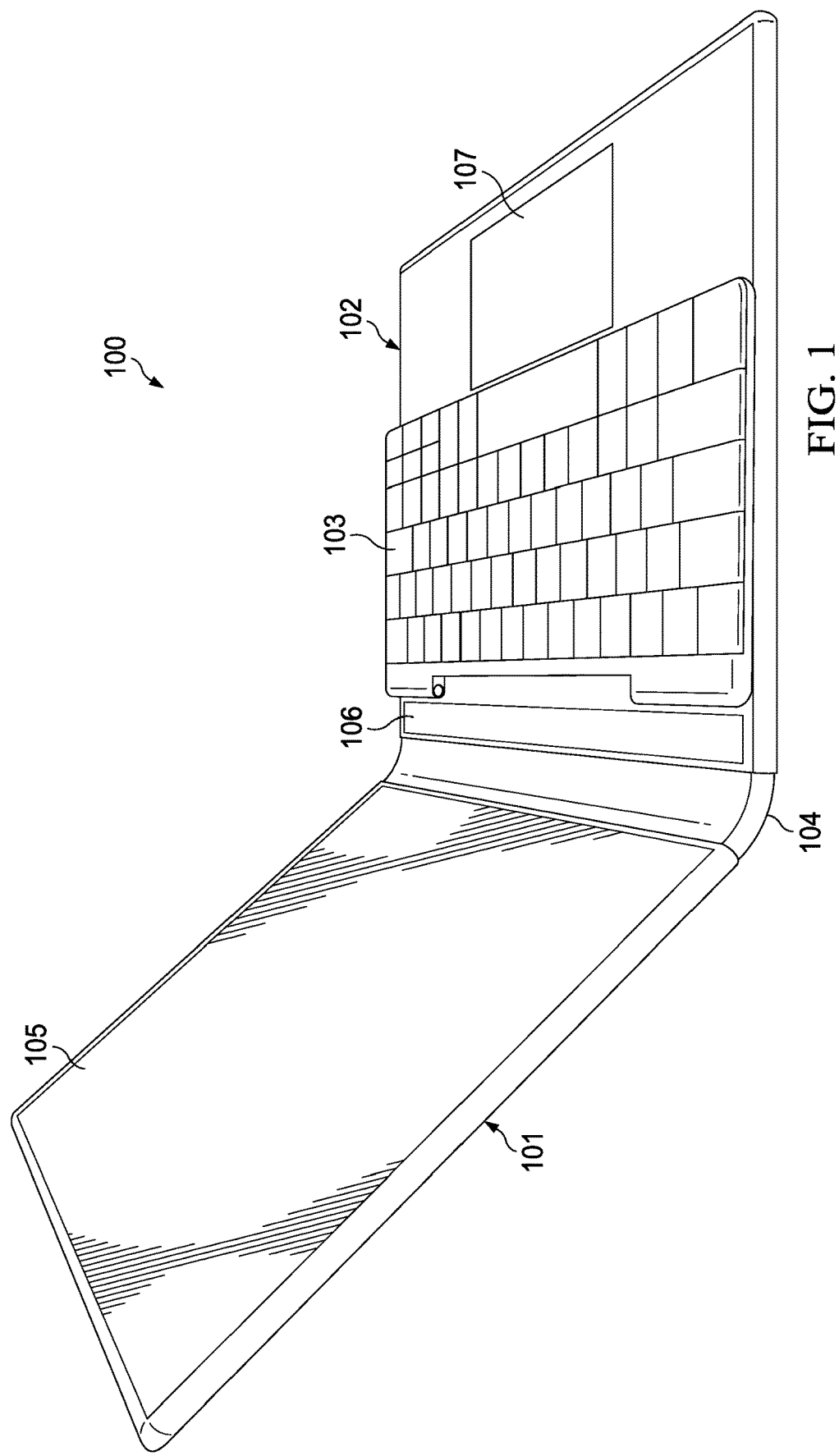
FIG. 1 is a perspective view of a multi-form factor Information Handling System (IHS) with a removable keyboard, according to some embodiments.

FIG. 1 is a perspective view of multi-form factor Information Handling System (IHS) 100 with removable keyboard 103. As shown, first display 101 is coupled to second display 102 via hinge 104, and keyboard 103 sits atop second display 102. The current physical arrangement of first display 101 and second display 102 creates a laptop posture, such that first display 101 becomes primary display area 105 presented by IHS 100, where video or display frames may be rendered for viewing by a user.

In operation, in this particular laptop posture, second display 102 may sit horizontally on a work surface with its display surface facing up, and keyboard 103 may be positioned on top of second display 102, occluding a part of its display surface. In response to this posture and keyboard position, IHS 100 may dynamically produce a first UI feature in the form of at least one configurable secondary display area 106 (a "ribbon area" or "touch bar"), and/or a second UI feature in the form of at least one configurable touch input area 107 (a "virtual trackpad"), using the touchscreen of second display 102.

To identify a current posture of IHS 100 and a current physical relationship or spacial arrangement (e.g., distance, position, speed, etc.) between display(s) 101/102 and keyboard 103, IHS 100 may be configured to use one or more sensors disposed in first display 101, second display 102, keyboard 103, and/or hinge 104. Based upon readings from these various sensors, IHS 100 may then select, configure, modify, and/or provide (e.g., content, size, position, etc.) one or more UI features.

In various embodiments, displays 101 and 102 may be coupled to each other via hinge 104 to thereby assume a plurality of different postures, including, but not limited, to: laptop, tablet, book, or display.

When display 102 is disposed horizontally in laptop posture, keyboard 103 may be placed on top of display 102, thus resulting in a first set of UI features (e.g., ribbon area or touch bar 106, and/or touchpad 107). Otherwise, with IHS 100 still in the laptop posture, keyboard 103 may be placed next to display 102, resulting in a second set of UI features.

As used herein, the term "ribbon area" or "touch bar" 106 refers to a dynamic horizontal or vertical strip of selectable and/or scrollable items, which may be dynamically selected for display and/or IHS control depending upon a present context, use-case, or application. For example, when IHS 100 is executing a web browser, ribbon area or touch bar 106 may show navigation controls and favorite websites. Then, when IHS 100 operates a mail application, ribbon area or touch bar 106 may display mail actions, such as replying or flagging. In some cases, at least a portion of ribbon area or touch bar 106 may be provided in the form of a stationary control strip, providing access to system features such as brightness and volume. Additionally, or alternatively, ribbon area or touch bar 106 may enable multitouch, to support two or more simultaneous inputs.

In some cases, ribbon area 106 may change position, location, or size if keyboard 103 is moved alongside a lateral or short edge of second display 102 (e.g., from horizontally displayed alongside a long side of keyboard 103 to being vertically displayed alongside a short side of keyboard 103). Also, the entire display surface of display 102 may show rendered video frames if keyboard 103 is moved alongside the bottom or long edge of display 102. Conversely, if keyboard 103 is removed of turned off, yet another set of UI features, such as an OSK, may be provided via display(s) 101/102. As such, in many embodiments, the distance and/or relative position between keyboard 103 and display(s) 101/102 may be used to control various aspects the UI.

During operation, the user may open, close, flip, swivel, or rotate either of displays 101 and/or 102, via hinge 104, to produce different postures. In each posture, a different arrangement between IHS 100 and keyboard 103 results in different UI features being presented or made available to the user. For example, when second display 102 is folded against display 101 so that the two displays have their backs against each other, IHS 100 may be said to have assumed a tablet posture (e.g., FIG. 7G) or book posture (e.g., FIG. 8D), depending upon whether IHS 100 is stationary, moving, horizontal, resting at a different angle, and/or its orientation (landscape vs. portrait).

In many of these scenarios, placement of keyboard 103 upon or near display(s) 101/102, and subsequent movement or removal, may result in a different set of UI features than when IHS 100 is in laptop posture.

In many implementations, different types of hinges 104 may be used to achieve and maintain different display postures, and to support different keyboard arrangements. Examples of suitable hinges 104 include, but are not limited to, the 360-hinge shown in FIGS. 12A-D). Hinge 104 may include wells or compartments for docking, cradling, charging, or storing accessories. Moreover, one or more aspects of hinge 104 may be monitored via one or more sensors (e.g., to determine whether an accessory is charging) when controlling the different UI features.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 2:
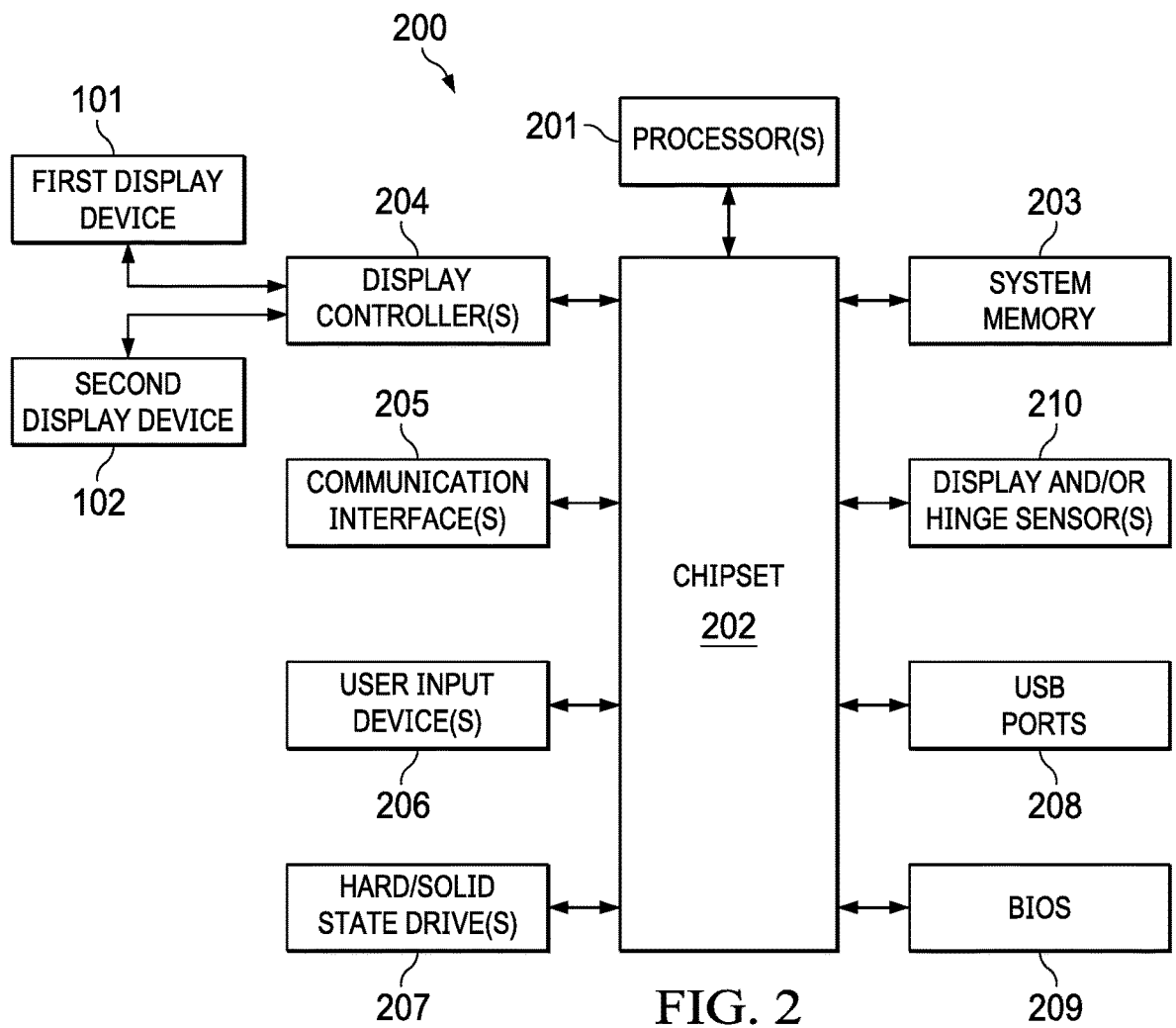
FIGS. 2 and 3 are block diagrams of components of the multi-form factor IHS and removable keyboard, respectively, according to some embodiments.

FIG. 2 is a block diagram of components 200 of multi-form factor IHS 100. As depicted, components 200 include processor 201. In various embodiments, IHS 100 may be a single-processor system, or a multi-processor system including two or more processors. Processor 201 may include any processor capable of executing program instructions, such as a PENTIUM series processor, or any general-purpose or embedded processors implementing any of a variety of Instruction Set Architectures (ISAs), such as an x86 ISA or a Reduced Instruction Set Computer (RISC) ISA (e.g., POWERPC, ARM, SPARC, MIPS, etc.).

IHS 100 includes chipset 202 coupled to processor 201. In certain embodiments, chipset 202 may utilize a QuickPath Interconnect (QPI) bus to communicate with processor 201. In various embodiments, chipset 202 may provide processor 201 with access to a number of resources. Moreover, chipset 202 may be coupled to communication interface(s) 205 to enable communications via various wired and/or wireless networks, such as Ethernet, WiFi, BLUETOOTH, cellular or mobile networks (e.g., CDMA, TDMA, LTE, etc.), satellite networks, or the like. For example, communication interface(s) 205 may be coupled to chipset 202 via a PCIe bus.

Chipset 202 may be coupled to display controller(s) 204, which may include one or more or graphics processor(s) (GPUs) on a graphics bus, such as an Accelerated Graphics Port (AGP) or Peripheral Component Interconnect Express (PCIe) bus. As shown, display controller(s) 204 provide video or display signals to first display device 101 and second display device 202. In other implementations, any number of display controller(s) 204 and/or display devices 101/102 may be used.

Each of display devices 101 and 102 may include a flexible display that is deformable (e.g., bent, folded, rolled, or stretched) by an external force applied thereto. For example, display devices 101 and 102 may include LCD, OLED, or AMOLED, plasma, electrophoretic, or electrowetting panel(s) or film(s). Each display device 101 and 102 may include a plurality of pixels arranged in a matrix, configured to display visual information, such as text, two-dimensional images, video, three-dimensional images, etc.

Display device(s) 101/102 may be configured to sense haptic and/or physical touch events, and to generate touch information. To this end, display device(s) 101/102 may include a touchscreen matrix (e.g., a layered capacitive panel or the like) and/or touch controller configured to receive and interpret multi-touch gestures from a user touching the screen with a stylus or one or more fingers. In some cases, display and touch control aspects of display device(s) 101/102 may be collectively operated and controlled by display controller(s) 204.

In some cases, display device(s) 101/102 may also comprise a deformation or bending sensor configured to generate deformation or bending information including, but not limited to: the bending position of a display (e.g., in the form of a "bending line" connecting two or more positions at which bending is detected on the display), bending direction, bending angle, bending speed, etc. In these implementations, display device(s) 101/102 may be provided as a single continuous display, rather than two discrete displays.

Chipset 202 may also provide processor 201 and/or display controller(s) 204 with access to memory 203. In various embodiments, system memory 203 may be implemented using any suitable memory technology, such as static RAM (SRAM), dynamic RAM (DRAM) or magnetic disks, or any nonvolatile/Flash-type memory, such as a solid-state drive (SSD) or the like. Memory 203 may store program instructions that, upon execution by processor 201 and/or controller(s) 204, present a UI interface to a user of IHS 100.

Chipset 202 may further provide access to one or more hard disk and/or solid-state drives 207. In certain embodiments, chipset 202 may also provide access to one or more optical drives or other removable-media drives. In certain embodiments, chipset 202 may also provide access to one or more Universal Serial Bus (USB) ports 208.

Upon booting of IHS 100, processor(s) 201 may utilize Basic Input/Output System (BIOS) 209 instructions to initialize and test hardware components coupled to IHS 100 and to load an Operating System (OS) for use by IHS 100.

BIOS 209 provides an abstraction layer that allows the OS to interface with certain hardware components that are utilized by IHS 100. Via the hardware abstraction layer provided by BIOS 209, software stored in memory 203 and executed by the processor(s) 201 of IHS 100 is able to interface with certain I/O devices that are coupled to the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

Chipset 202 may also provide access to one or more user input devices 206, for example, using a super I/O controller or the like. For instance, chipset 202 may provide access to a keyboard (e.g., keyboard 103), mouse, trackpad, stylus, totem, or any other peripheral input device, including touchscreen displays 101 and 102. These input devices may interface with chipset 202 through wired connections (e.g., in the case of touch inputs received via display controller(s) 204) or wireless connections (e.g., via communication interfaces(s) 205). In some cases, chipset 202 may be used to interface with user input devices such as keypads, biometric scanning devices, and voice or optical recognition devices.

In certain embodiments, chipset 202 may also provide an interface for communications with one or more sensors 210. Sensors 210 may be disposed within displays 101/102 and/or hinge 104, and may include, but are not limited to: electric, magnetic, radio, optical, infrared, thermal, force, pressure, acoustic, ultrasonic, proximity, position, deformation, bending, direction, movement, velocity, rotation, and/or acceleration sensor(s).

Figure 3:
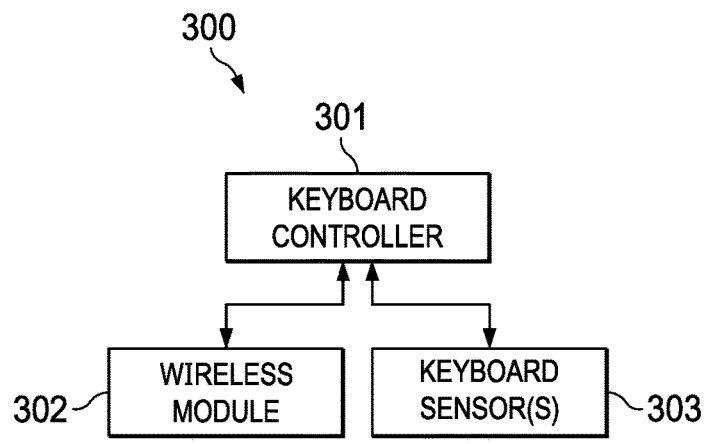

FIG. 3 is a block diagram of components 300 of keyboard IHS 103. As depicted, components 300 include keyboard controller or processor 301, coupled to keyboard sensor(s) 303 and wireless communication module 302. In various embodiments, keyboard controller 301 may be configured to detect keystrokes made by user upon a keyboard matrix, and it may transmit those keystrokes to IHS 100 via wireless module 302 using a suitable protocol (e.g., BLUETOOTH). Keyboard sensors 303, which may also include any of the aforementioned types of sensor(s), may be disposed under keys and/or around the keyboard's enclosure, to provide information regarding the location, arrangement, or status of keyboard 103 to IHS 100 via wireless module 302.

In various embodiments, IHS 100 and/or keyboard 103 may not include all of components 200 and/or 300 shown in FIGS. 2 and 3, respectively. Additionally, or alternatively, IHS 100 and/or keyboard 103 may include components in addition to those shown in FIGS. 2 and 3, respectively. Additionally, or alternatively, components 200 and/or 300, represented as discrete in FIGS. 2 and 3, may be integrated with other components. For example, all or a portion of the functionality provided by components 200 and/or 300 may be provided as a System-On-Chip (SOC), or the like.

Figure 4:
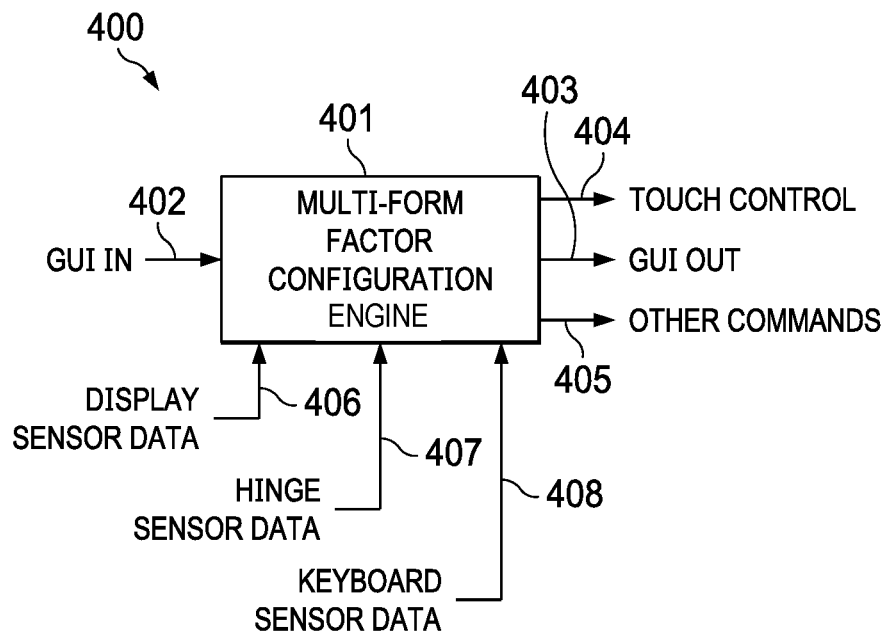
FIG. 4 is a block diagram of a multi-form factor configuration engine, according to some embodiments.

FIG. 4 is a block diagram of multi-form factor configuration engine 401. Particularly, multi-form factor configuration engine 401 may include electronic circuits and/or program instructions that, upon execution, cause IHS 100 to perform a number of operation(s) and/or method(s) described herein.

In various implementations, program instructions for executing multi-form factor configuration engine 401 may be stored in memory 203. For example, engine 401 may include one or more standalone software applications, drivers, libraries, or toolkits, accessible via an Application Programming Interface (API) or the like. Additionally, or alternatively, multi-form factor configuration engine 401 may be included the IHS's OS.

In other embodiments, however, multi-form factor configuration engine 401 may be implemented in firmware and/or executed by a co-processor or dedicated controller, such as a Baseband Management Controller (BMC), or the like.

As illustrated, multi-form factor configuration engine 401 receives Graphical User Interface (GUI) input or feature 402, and produces GUI output or feature 403, in response to receiving and processing one or more or: display sensor data 406, hinge sensor data 407, and/or keyboard sensor data 408. Additionally, or alternatively, multi-form factor configuration engine 401 may produce touch control feature 404 and/or other commands 405.

In various embodiments, GUI input 402 may include one or more images to be rendered on display(s) 101/102, and/or one or more entire or partial video frames. Conversely, GUI output 403 may include one or more modified images (e.g., different size, color, position on the display, etc.) to be rendered on display(s) 101/102, and/or one or more modified entire or partial video frames.

For instance, in response to detecting, via display and/or hinge sensors 406/407, that IHS 100 has assumed a laptop posture from a closed or "off" posture, GUI OUT 403 may allow a full-screen desktop image, received as GUI IN 402, to be displayed first display 101 while second display 102 remains turned off or darkened. Upon receiving keyboard sensor data 408 indicating that keyboard 103 has been positioned over second display 102, GUI OUT 403 may produce a ribbon-type display or area 106 around the edge(s) of keyboard 103, for example, with interactive and/or touch selectable virtual keys, icons, menu options, pallets, etc. If keyboard sensor data 408 then indicates that keyboard 103 has been turned off, for example, GUI OUT 403 may produce an OSK on second display 102.

Additionally, or alternatively, touch control feature 404 may be produced to visually delineate touch input area 107 of second display 102, to enable its operation as a user input device, and to thereby provide an UI interface commensurate with a laptop posture. Touch control feature 404 may turn palm or touch rejection on or off in selected parts of display(s) 101/102. Also, GUI OUT 403 may include a visual outline displayed by second display 102 around touch input area 107, such that palm or touch rejection is applied outside of the outlined area, but the interior of area 107 operates as a virtual trackpad on second display 102.

Multi-form factor configuration engine 401 may also produce other commands 405 in response to changes in display posture and/or keyboard sate or arrangement, such as commands to turn displays 101/102 on or off, enter a selected power mode, charge or monitor a status of an accessory device (e.g., docked in hinge 104), etc.

Figure 5:
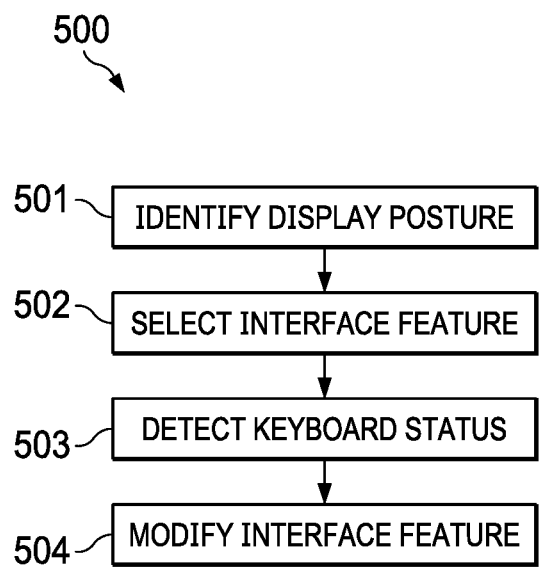
FIG. 5 is a flowchart of a method for configuring multi-form factor IHSs, according to some embodiments.

FIG. 5 is a flowchart of method 500 for configuring multi-form factor IHSs. In various embodiments, method 500 may be performed by multi-form factor configuration engine 401 under execution of processor 201. At block 501, method 500 includes identifying a display posture—that is, a relative physical arrangement between first display 101 and second display 102. For example, block 501 may use sensor data received from displays 101/102 and/or hinge 104 to distinguish among the various postures shown below.

At block 502, method 500 selects a UI feature corresponding to the identified posture. Examples of UI features include, but are not limited to: turning a display on or off; displaying a full or partial screen GUI; displaying a ribbon area; providing a virtual trackpad area; altering touch control or palm rejection settings; adjusting the brightness and contrast of a display; selecting a mode, volume, and/or or directionality of audio reproduction; etc.

At block 503, method 500 may detect the status of keyboard 103. For example, block 503 may determine that keyboard 103 is on or off, resting between two closed displays, horizontally sitting atop display(s) 101/102, or next to display(s) 101/102. Additionally, or alternatively, block 503 may determine the location or position of keyboard 103 relative to display 102, for example, using Cartesian coordinates. Additionally, or alternatively, block 503 may determine an angle between keyboard 103 and displays 101/102 (e.g., a straight angle if display 102 is horizontal, or a right angle if display 102 is vertical).

Then, at block 504, method 500 may modify the UI feature in response to the status of keyboard 103. For instance, block 504 may cause a display to turn on or off, it may change the size or position of a full or partial screen GUI or a ribbon area, it may change the size or location of a trackpad area with changes to control or palm rejection settings, etc. Additionally, or alternatively, block 504 may produce a new interface feature or remove an existing feature, associated with a display posture, in response to any aspect of the keyboard status meeting a selected threshold of falling within a defined range of values.

FIGS. 6A-C, 7A-J, 8A-D, and 9A-F illustrate examples of laptop, tablet, book, and display postures which may be detected by operation of block 501 of method 500 during execution of multi-form factor configuration engine 401 by IHS 100.

Figure 6A:
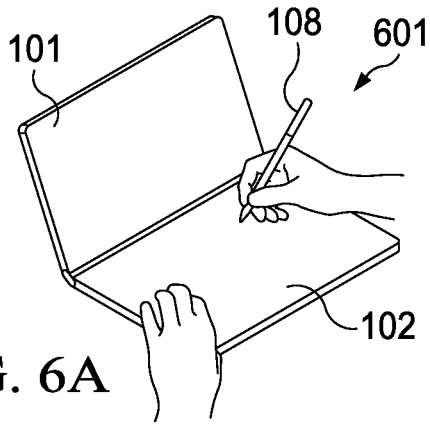
FIGS. 6A-C, 7A-J, 8A-D, and 9A-F illustrate examples of laptop, tablet, book, and display postures, respectively, according to some embodiments.
Figure 6B:
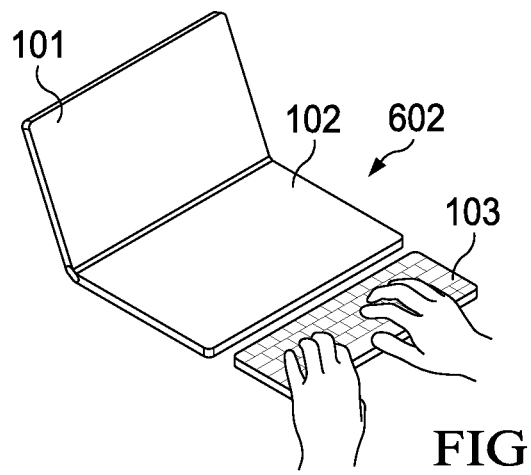
Figure 6C:
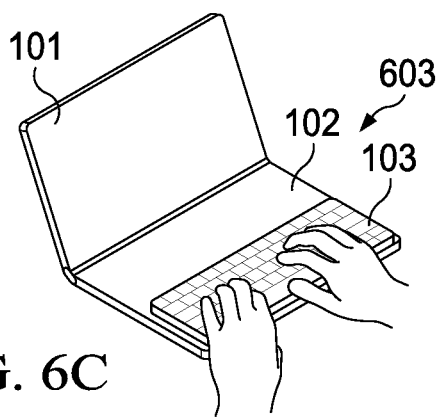

Particularly, FIGS. 6A-C show a laptop posture, where a first display surface of first display 101 is facing the user at an obtuse angle with respect to a second display surface of second display 102, and such that second display 102 is disposed in a horizontal position, with the second display surface facing up. In FIG. 6A, state 601 shows a user operating IHS 100 with a stylus or touch on second display 102. In FIG. 6B, state 602 shows IHS 100 with keyboard 103 positioned off the bottom edge or long side of second display 102, and in FIG. 6C, state 603 shows the user operating keyboard 103 atop second display 102.

Figure 7A:
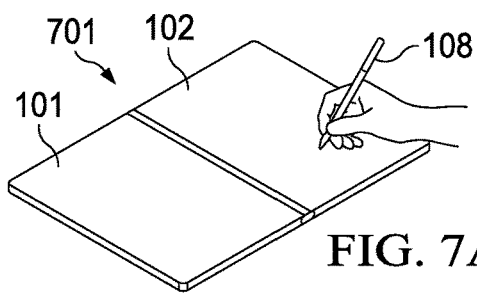
Figure 7B:
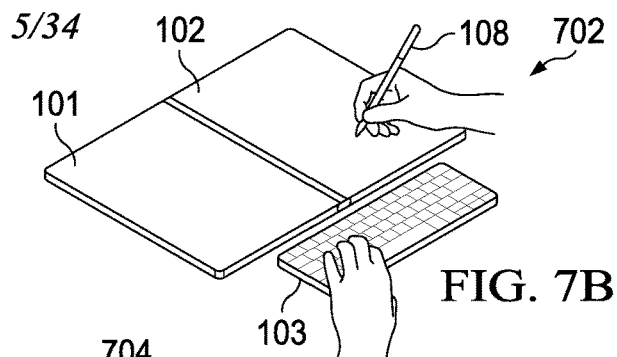
Figure 7C:
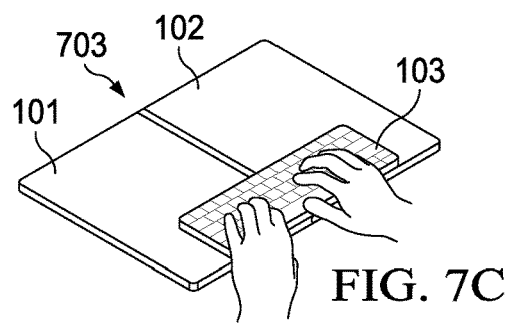
Figure 7D:
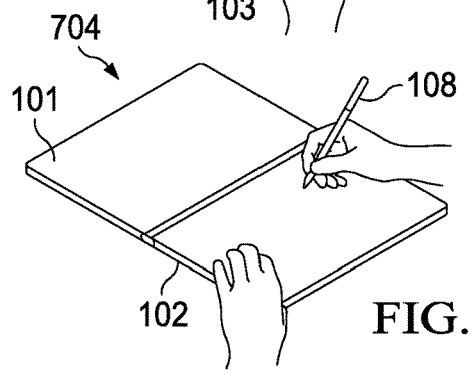
Figure 7E:
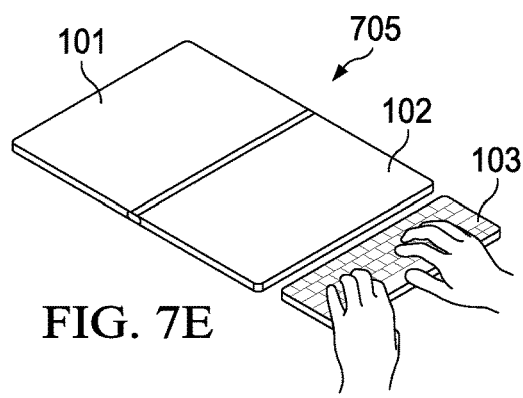
Figure 7F:
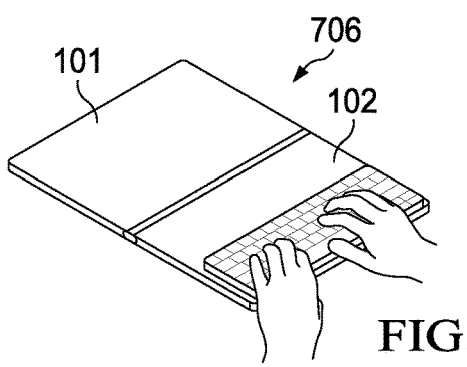

FIGS. 7A-J show a tablet posture, where first display 101 is at a straight angle with respect to second display 102, such that first and second displays 101 and 102 are disposed in a horizontal position, with the first and second display surfaces facing up. Specifically, FIG. 7A shows state 701 where IHS 100 is in a side-by-side, portrait orientation without keyboard 103, FIG. 7B shows state 702 where keyboard 103 is being used off the bottom edges or short sides of display(s) 101/102, and FIG. 7C shows state 703 where keyboard 103 is located over both displays 101 and 102. In FIG. 7D, state 704 shows IHS 100 in a side-by-side, landscape configuration without keyboard 103, in FIG. 7E state 705 shows keyboard 103 being used off the bottom edge or long side of second display 102, and in FIG. 7F state 706 shows keyboard 103 on top of second display 102.

Figure 7G:
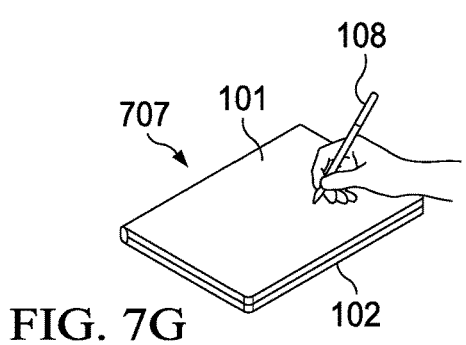
Figure 7H:
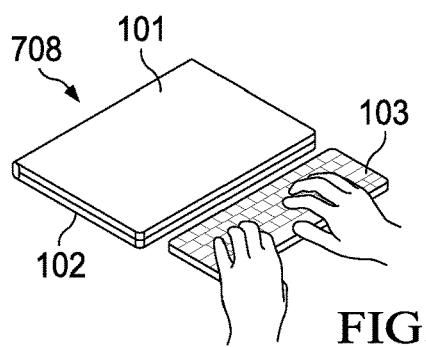
Figure 7I:
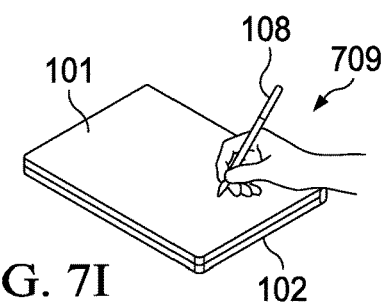
Figure 7J:
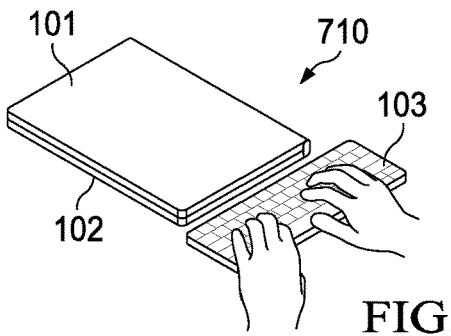

In FIG. 7G, state 707 shows first display 101 rotated around second display 102 via hinge 104 such that the display surface of second display 102 is horizontally facing down, and first display 101 rests back-to-back against second display 102, without keyboard 103; and in FIG. 7H, state 708 shows the same configuration, but with keyboard 103 placed off the bottom or long edge of display 102. In FIGS. 7I and 7J, states 709 and 710 correspond to states 707 and 708, respectively, but with IHS 100 in a portrait orientation.

Figure 8A:
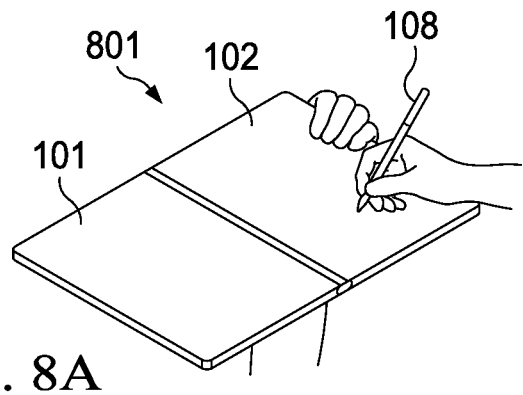
Figure 8B:
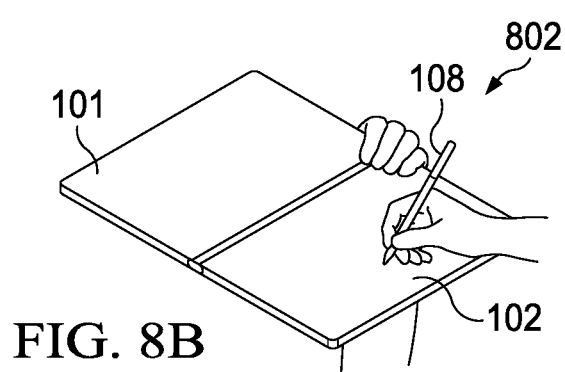
Figure 8C:
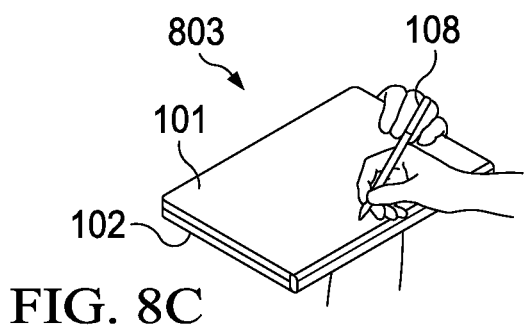
Figure 8D:
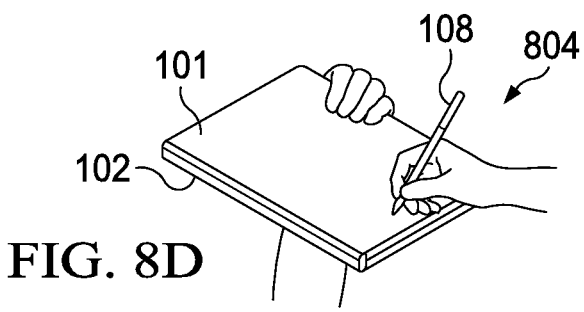

FIG. 8A-D show a book posture, similar to the tablet posture of FIGS. 7A-J, but such that neither one of displays 101 or 102 is horizontally held by the user and/or such that the angle between the display surfaces of the first and second displays 101 and 102 is other than a straight angle. In FIG. 8A, state 801 shows dual-screen use in portrait orientation, in FIG. 8B state 802 shows dual-screen use in landscape orientation, in FIG. 8C state 803 shows single-screen use in landscape orientation, and in FIG. 8D state 804 shows single-screen use in portrait orientation.

Figure 9A:
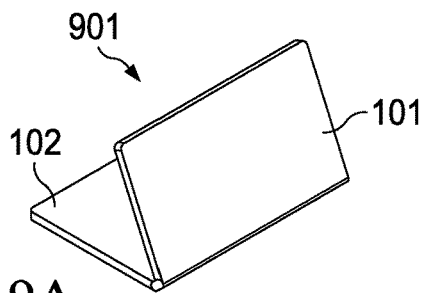
Figure 9B:
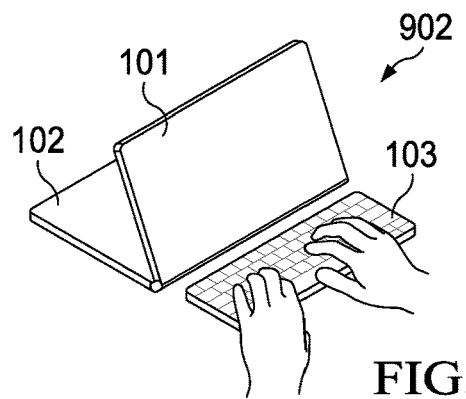
Figure 9C:
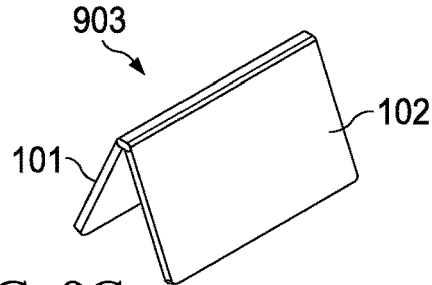
Figure 9D:
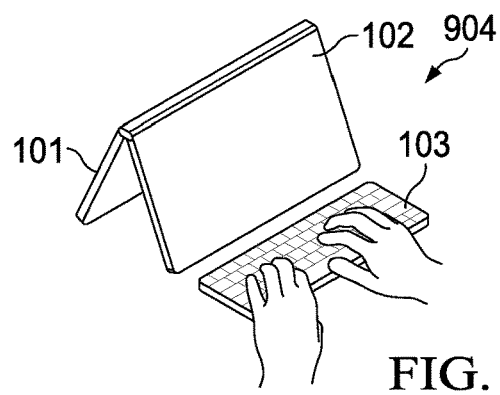
Figure 9E:
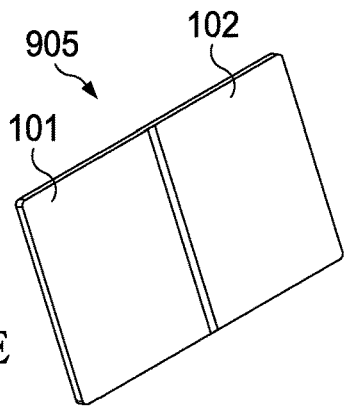
Figure 9F:
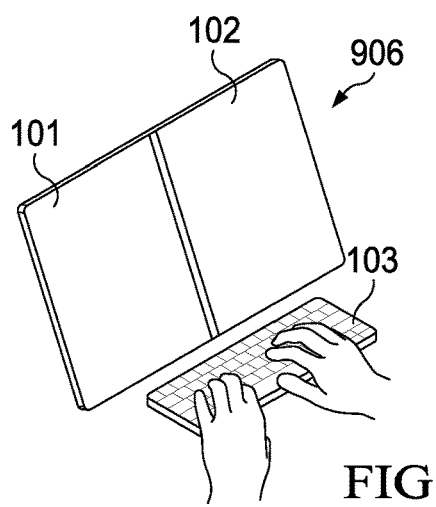

FIGS. 9A-F show a display posture, where first display 100 is at an acute angle with respect to second display 102, and/or where both displays are vertically arranged in a portrait orientation. Particularly, in FIG. 9A state 901 shows a first display surface of first display 102 facing the user and the second display surface of second display 102 horizontally facing down, whereas in FIG. 9B state 902 shows the same configuration but with keyboard 103 used off the bottom edge or long side of display 101. In FIG. 9C, state 903 shows a display posture where display 102 props up display 101 in a stand configuration, and in FIG. 9D, state 904 shows the same configuration but with keyboard 103 used off the bottom edge or long side of display 101. In FIG. 9E, state 905 shows both displays 101 and 102 resting vertically or at display angle, and in FIG. 9F state 906 shows the same configuration but with keyboard 103 used off the bottom edge or long side of display 101.

It should be noted that the aforementioned postures, and their various respective keyboard states, are described for sake of illustration. In different embodiments, however, other postures and keyboard states may be used, for example, depending upon the type of hinge coupling the displays, the number of displays used, or other accessories. For instance, when IHS 100 is chargeable via a charging or docking station, the connector in the docking station may be configured to hold IHS 100 at angle selected to facility one of the foregoing postures (e.g., keyboard states 905 and 906).

FIGS. 10A-C illustrate a first example use-case of method 500 in the context of a laptop posture. In state 1000A of FIG. 10A, first display 101 shows primary display area 1001, keyboard 103 sits atop second display 102, and second display 102 provides UI features such as first ribbon area 1002 (positioned between the top long edge of keyboard 103 and hinge 104) and touch area 1003 (positioned below keyboard 103). As keyboard 103 moves up or down on the surface of display 102, ribbon area 1002 and/or touch area 1003 may dynamically move up or down, or become bigger or smaller, on second display 102. In some cases, when keyboard 103 is removed, a virtual OSK may be rendered (e.g., at that same location) on the display surface of display 102.

In state 1000B of FIG. 10B, in response to execution of method 500 by multi-form factor configuration engine 401, first display 101 continues to show main display area 1001, but keyboard 103 has been moved off of display 102. In response, second display 102 now shows secondary display area 1004 and also second ribbon area 1005. In some cases, second ribbon area 1005 may include the same UI features (e.g., icons, etc.) as also shown in area 1002, but here repositioned to a different location of display 102 nearest the long edge of keyboard 103. Alternatively, the content of second ribbon area 1005 may be different from the content of first ribbon area 1002.

In state 1000C of FIG. 100, during execution of method 500 by multi-form factor configuration engine 401, IHS 100 detects that physical keyboard 103 has been removed (e.g., out of wireless range) or turned off (e.g., low battery), and in response display 102 produces a different secondary display area 1006 (e.g., smaller than 1004), as well as OSK 1007.

FIGS. 11A-C illustrate a second example use-case of method 500 in the context of a tablet posture. In state 1100A of FIG. 11A, second display 102 has its display surface facing up, and is disposed back-to-back with respect to second display 102, as in states 709/710, but with keyboard 103 sitting atop second display 102. In this state, display 102 provides UI features such primary display area 1101 and first ribbon area 1102, positioned as shown. As keyboard 103 is repositioned up or down on the surface of display 102, display area 1101, first ribbon area 1102, and/or touch area 1103 may also be moved up or down, or made bigger or smaller, by multi-form factor configuration engine 401.

In state 1100B of FIG. 11B, keyboard 103 is detected off of the surface of display 102. In response, first display 101 shows modified main display area 1103 and modified ribbon area 1104. In some cases, modified ribbon area 1104 may include the same UI features as area 1102, but here repositioned to a different location of display 102 nearest the long edge of keyboard 103. Alternatively, the content of second ribbon area 1104 may be different from the content of first ribbon area 1102. In some cases, the content and size of modified ribbon area 1104 may be selected in response to a distance between keyboard 103 and display 102.

In state 1100C of FIG. 11C, during continued execution of method 500, multi-form factor configuration engine 401 detects that physical keyboard 103 has been removed or turned off, and in response display 102 produces yet another display area 1105 (e.g., larger than 1003 or 1002), this time without an OSK.

In various embodiments, the different UI behaviors discussed in the aforementioned use-cases may be set, at least in part, by policy and/or profile, and stored in a preferences database for each user. In this manner, UI features and modifications of blocks 502 and 504, such as whether touch input area 1003 is produced in state 1000A (and/or its size and position on displays 101/102), or such as whether ribbon area 1102 is produced in state 1100A (and/or its size and position on displays 101/102), may be configurable by a user.

FIGS. 12A-D illustrate a 360-hinge implementation, usable as hinge 104 in IHS 100, in four different configurations 1200A-D, respectively. Particularly, 360-hinge 104 may include a plastic, acrylic, polyamide, polycarbonate, elastic, and/or rubber coupling, with one or more internal support, spring, and/or friction mechanisms that enable a user to rotate displays 101 and 102 relative to one another, around the axis of 360-hinge 104.

Hinge configuration 1200A of FIG. 12A may be referred to as a closed posture, where at least a portion of a first display surface of the first display 101 is disposed against at least a portion of a second display surface of the second display 102, such that the space between displays 101/102 accommodates keyboard 103. When display 101 is against display 102, stylus or accessory 108 may be slotted into keyboard 103. In some cases, stylus 108 may have a diameter larger than the height of keyboard 103, so that 360-hinge 104 wraps around a portion of the circumference of stylus 108 and therefore holds keyboard 103 in place between displays 101/102.

Hinge configuration 1200B of FIG. 12B shows a laptop posture between displays 101/102. In this case, 360-hinge 104 holds first display 101 up, at an obtuse angle with respect to first display 101. Meanwhile, hinge configuration 1200C of FIG. 12C shows a tablet, book, or display posture (depending upon the resting angle and/or movement of IHS 100), with 360-hinge 104 holding first and second displays 101/102 at a straight angle)(180°) with respect to each other. And hinge configuration 1200D of FIG. 12D shows a tablet or book configuration, with 360-hinge 104 holding first and second displays 101 and 102 at a 360° angle, with their display surfaces in facing opposite directions.

Figure 13:
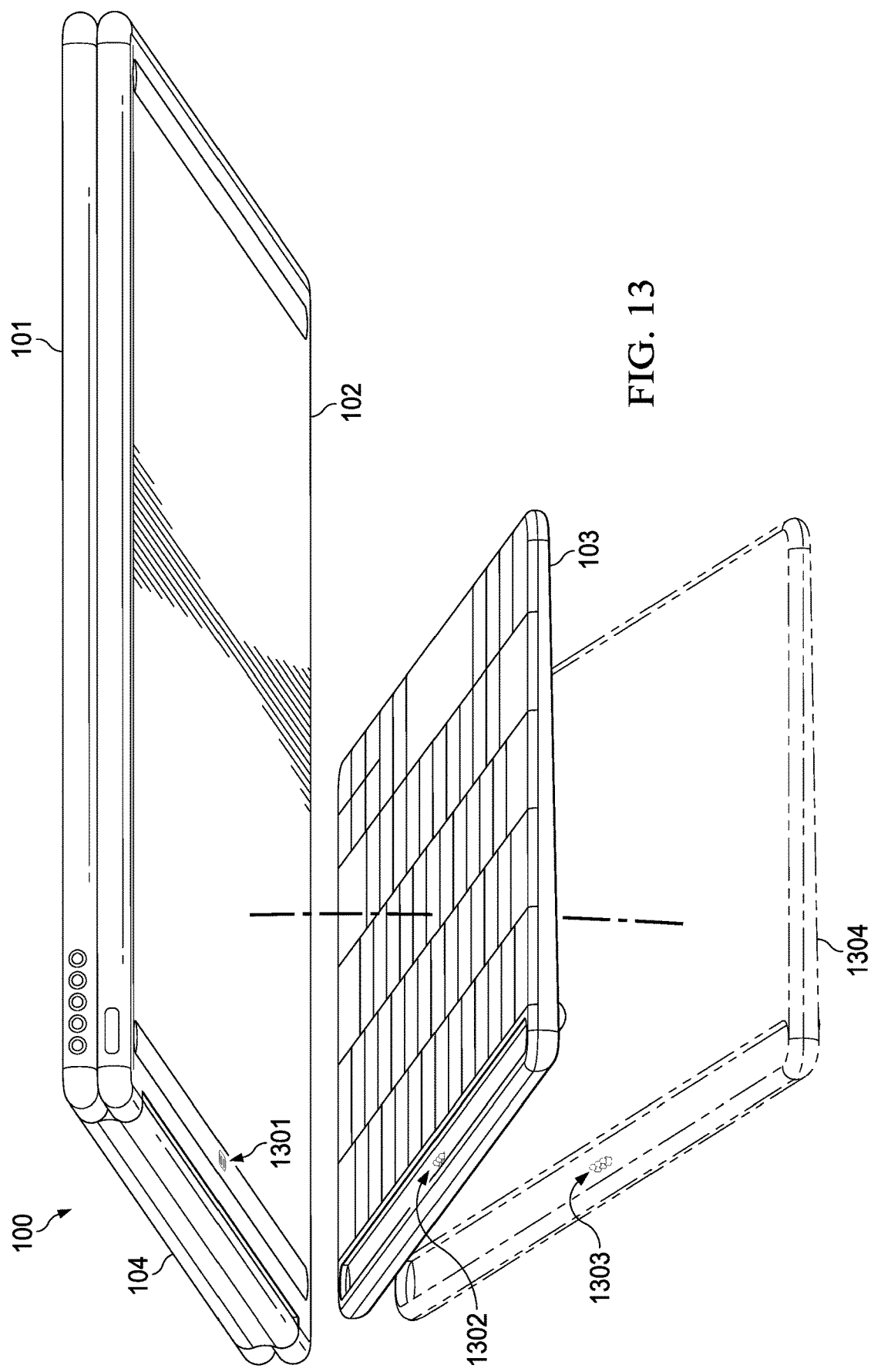
FIG. 13 illustrates a swappable backpack system, according to some embodiments.

FIG. 13 illustrates an example of a swappable backpack system for IHS 100. Here IHS 100 is itself in a or clamshell configuration, such that the display surfaces of displays 101/102 are closed against each other. The underside of IHS 100 includes interface 1301 (e.g., contact pads), which connects to connector 1302 (e.g., pogo pins) of keyboard 103 and/or to connector 1303 of battery accessory 1304.

In some cases, terminal or connector 1301 enables keyboard 103 to be carried along with IHS 100 while connected to the bottom of IHS 100; as a natural part of the product, ready and charged upon deployment. While keyboard 103 is connected to IHS 103, it may be charged by an internal battery (distinct from battery accessory 1304) disposed within IHS 100. When keyboard 103 is deployed, sensors in the keyboard (e.g., inertial sensors) may indicate its current state to IHS 100 via terminals or connectors 1301 and 1302. Accordingly, interface 1301 may be used for swapping keyboard 103 for another accessory, such as an extra battery or juice-pack.

FIGS. 14A and 14B depict multi-form factor IHS 100 with keyboard 103 coupled to an underside of display 102 while in laptop posture. In view 1400A, keyboard 103 is stowed under display 102—which, on a flat surface, produces angle 1401 (e.g.,2.5°). View 1400B shows an On-Screen Keyboard (OSK) 1402 being used while keyboard 103 still sits on a horizontal surface, under display 102.

Figure 15A:
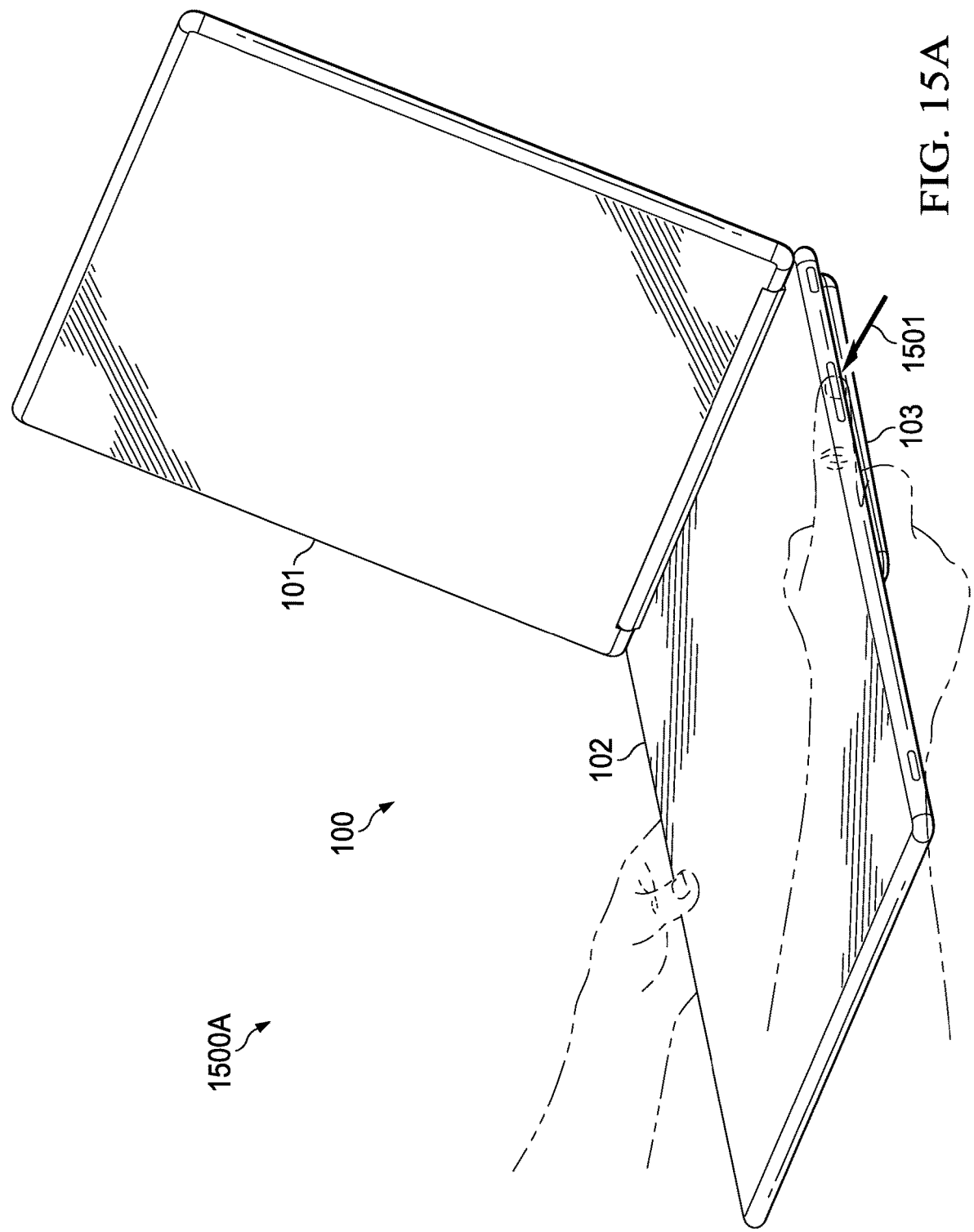
Figure 15B:
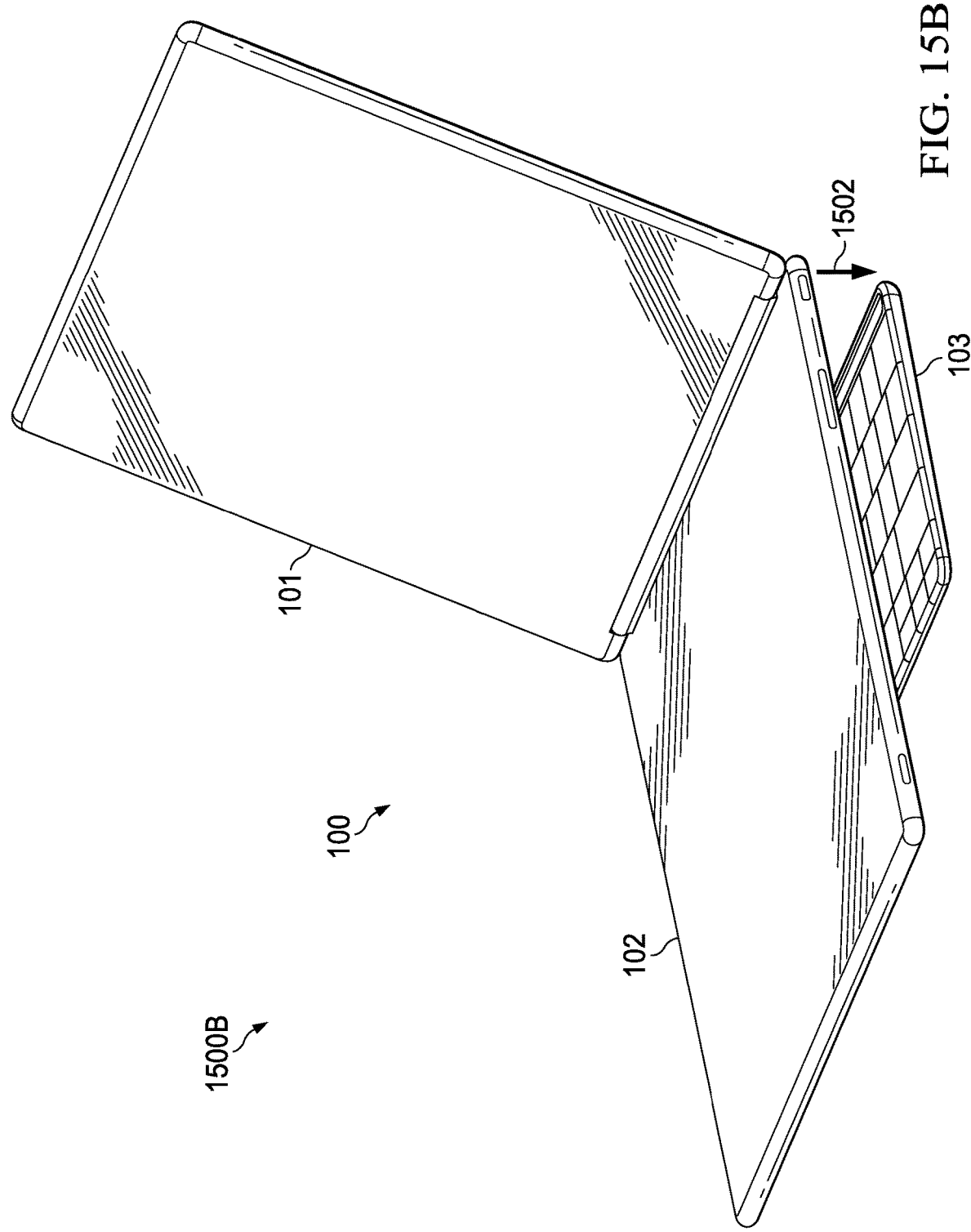

FIGS. 15A-C illustrate a method for deploying keyboard 103 using actuator 1501. In configuration 1500A, a user picks up IHS 100 and activates an actuator or trigger 1501 (e.g., a push button, a sliding switch, etc.). In response, configuration 1500B shows keyboard 103 released from the underside of display 102, in downward direction 1502, laying on a flat surface under IHS 100. Then, in configuration 1500C, the user moves IHS 100 in direction 1503, to place it behind keyboard 103. Although actuator 1501 is shown as a physical implementation, in some cases actuator 1501 may be a software button or feature displayed on a Graphical User Interface 1501 (e.g., on the display surface of displays 101/102).

Figure 16:
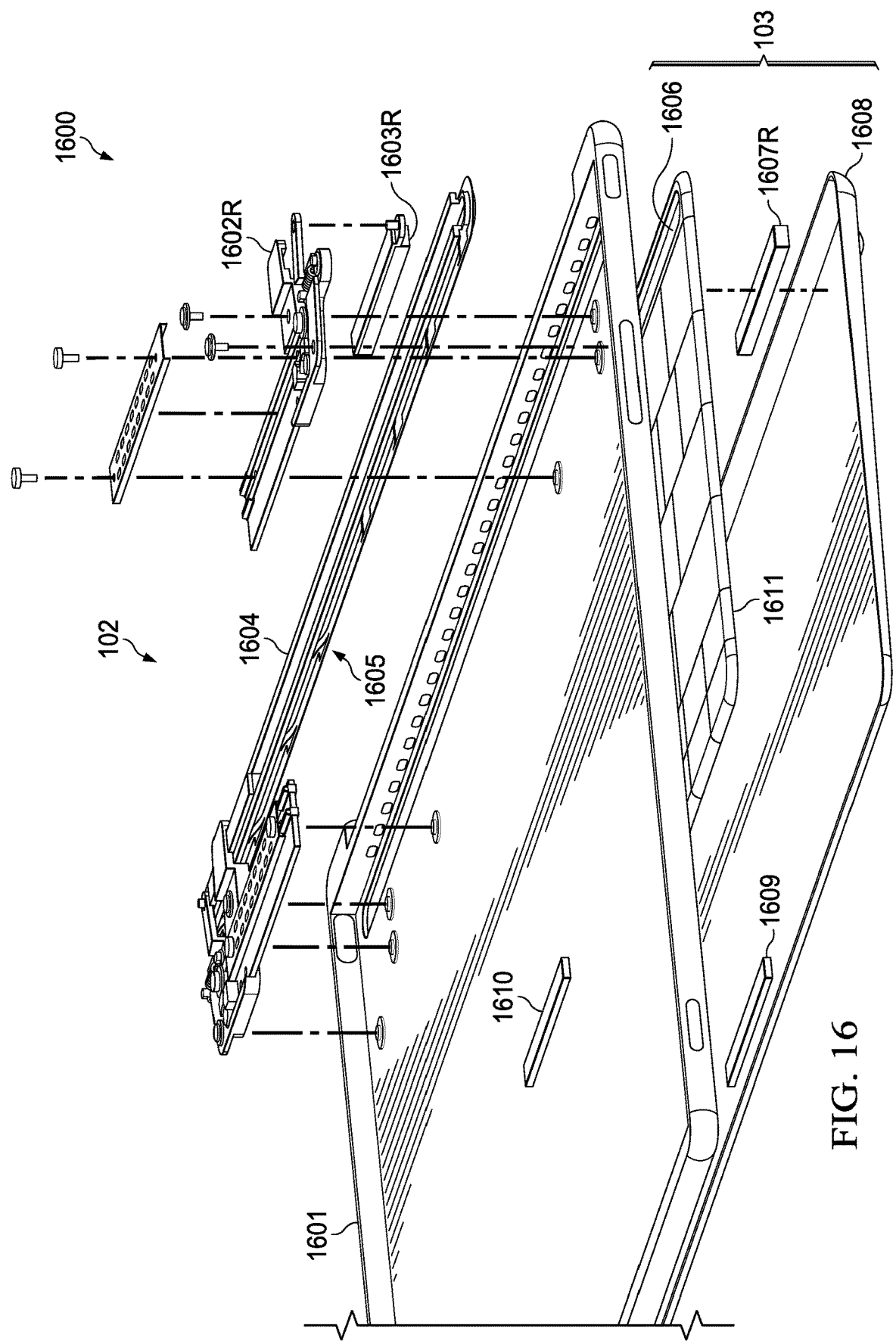
FIG. 16 illustrates a system for deploying a keyboard by misaligning magnets, according to some embodiments.
Figure 17A:
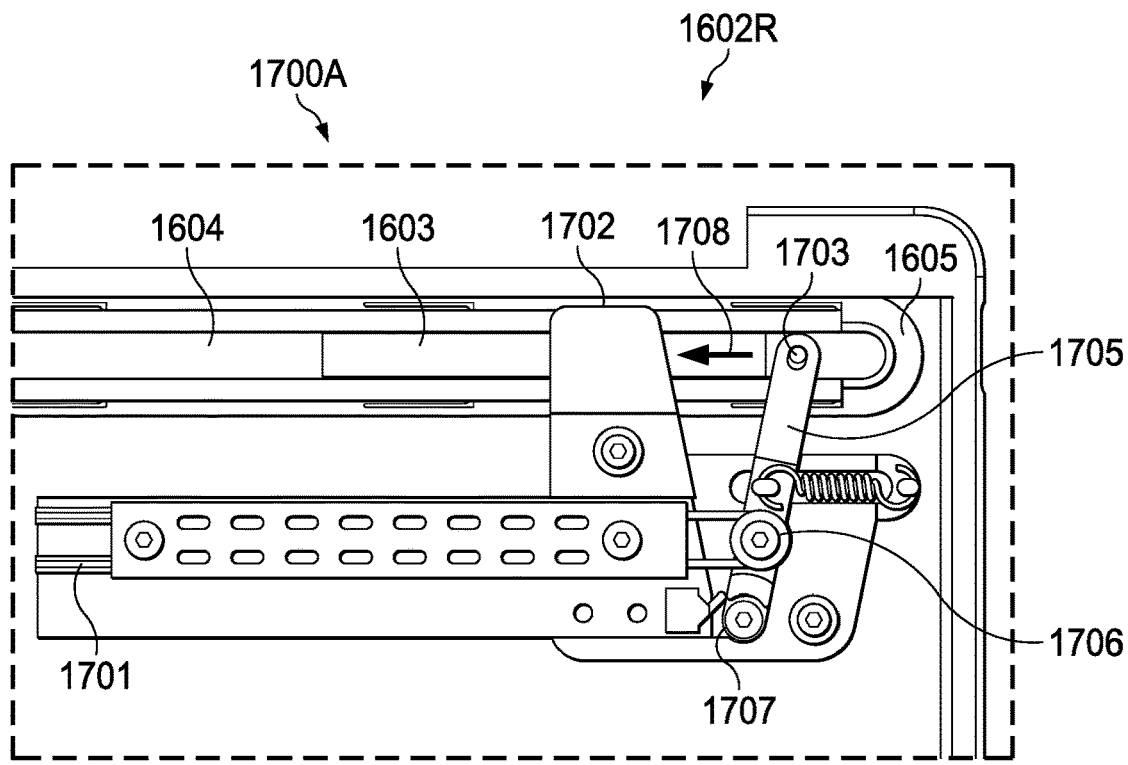
FIGS. 17A-C, 18A, and 18B illustrate operation of the system for deploying a keyboard by misaligning magnets, according to some embodiments.
Figure 17B:
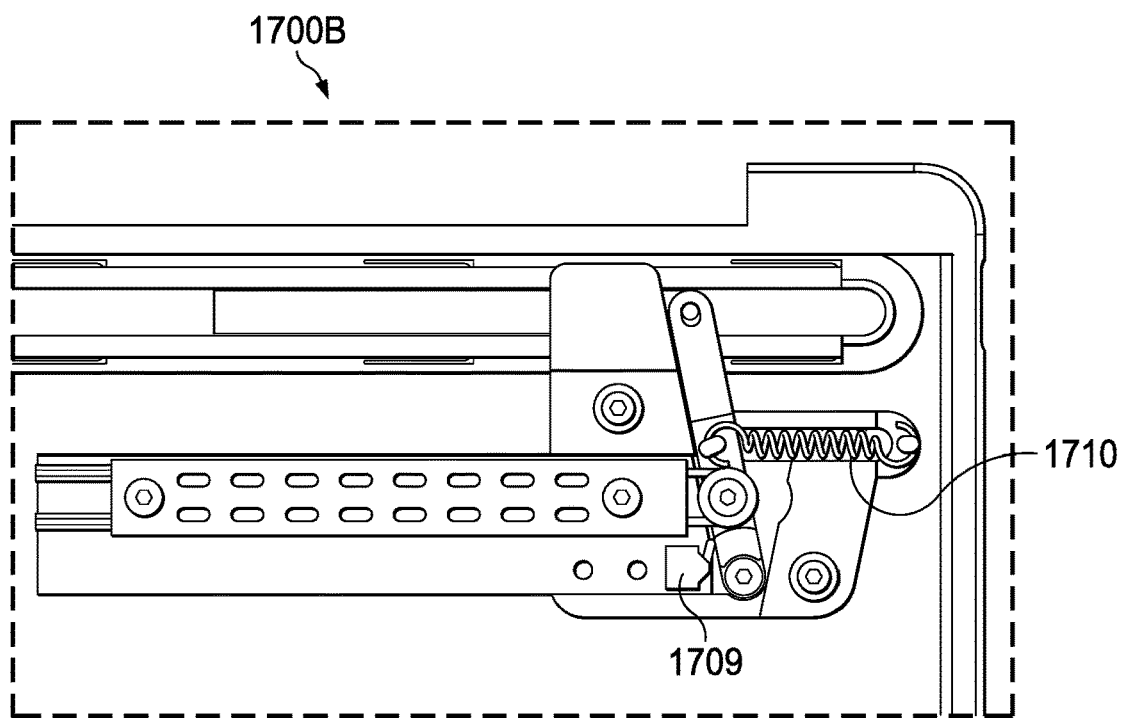
Figure 17C:
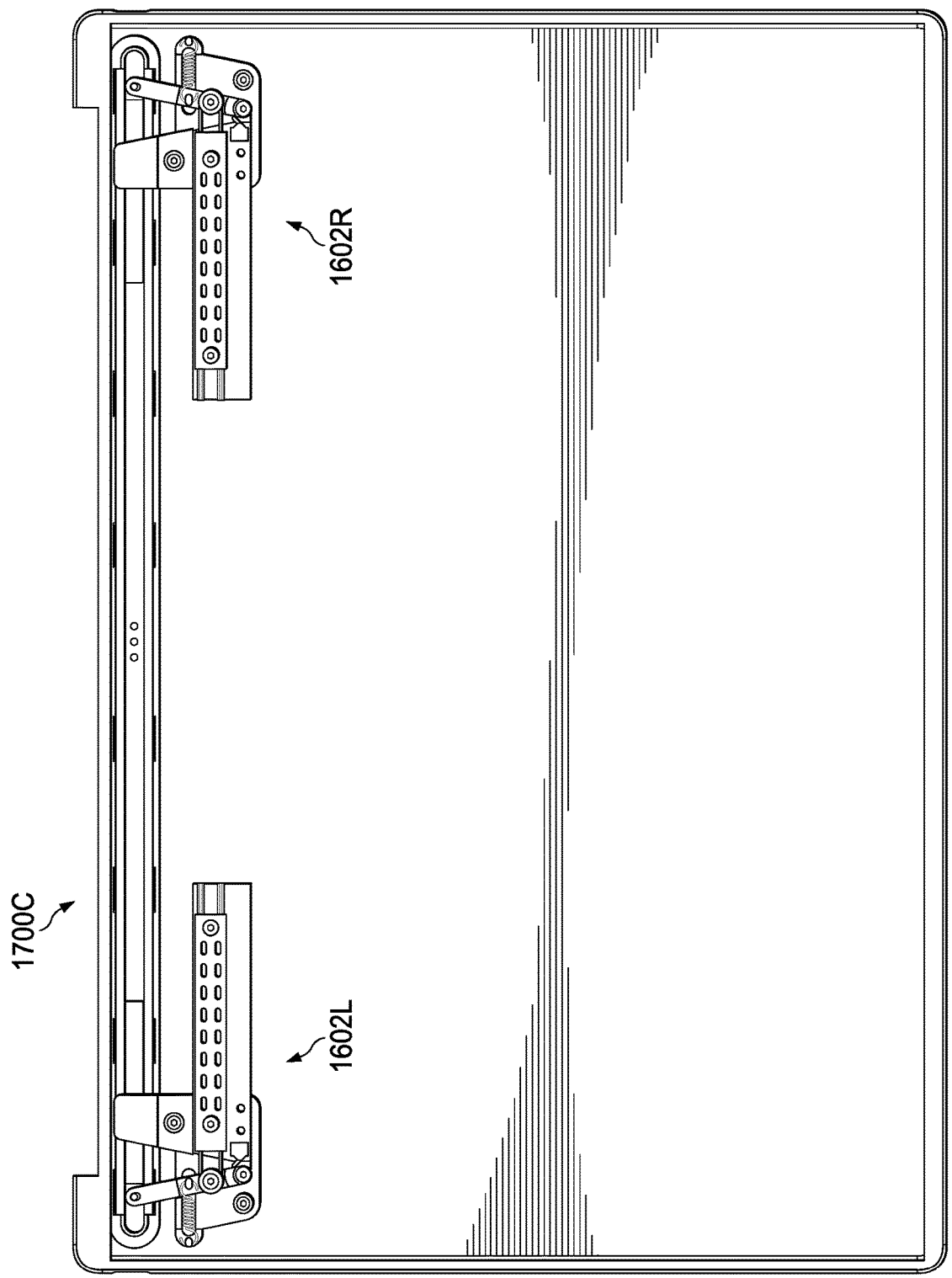
Figure 18A:
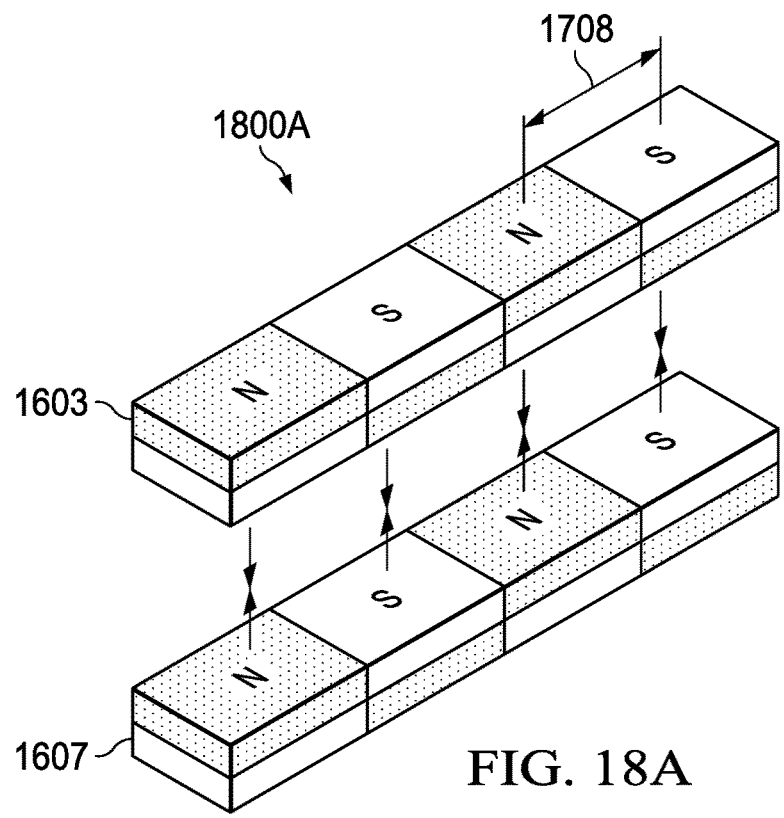
Figure 18B:
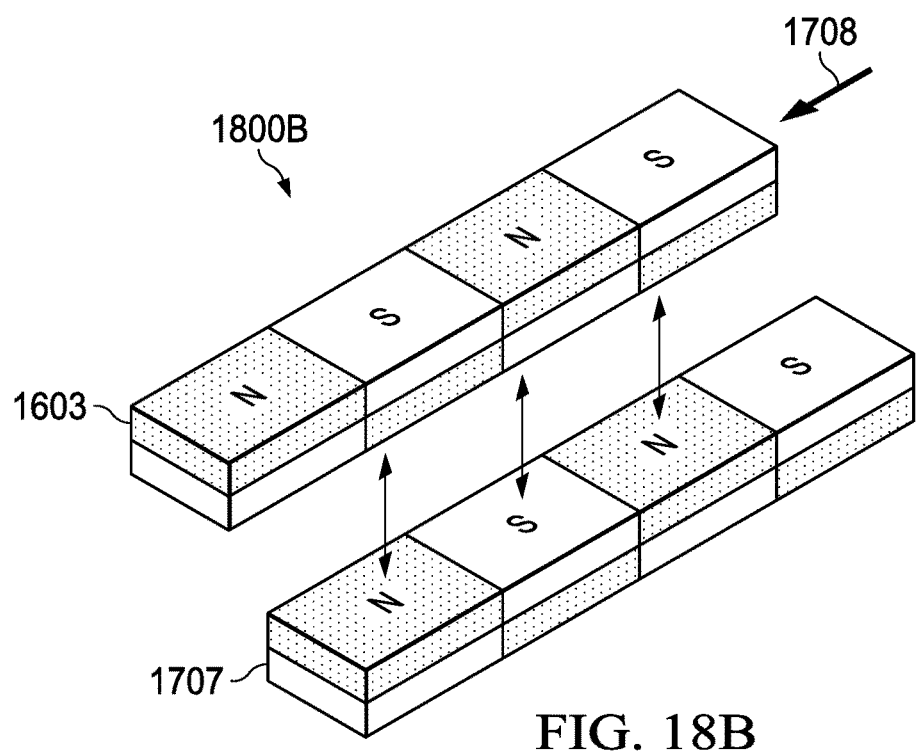

FIG. 16 illustrates a system for deploying a keyboard by misaligning magnets. As illustrated, case or chassis 1601 of display 102 holds magnet 1610 and case or chassis 1608 of keyboard 103 holds corresponding magnet 1609, for example, under a space bar of keyboard 103 having a plurality of keycaps 1611.

First right-side magnet 1603R is disposed within case 1601 of display 102, and second right-side magnet 1607R is disposed in keyboard 103. Together, magnets 1603R and 1607R create attractive and repulsive magnetic forces in the Z (vertical) direction. In some cases, each of magnets 1603R and 1607R may be 4-pole magnets. Moreover, magnets 1603R and 1607R have symmetric counterparts on the left side.

Release mechanism 1602R is configured to align and misalign the poles of magnets 1603R and 1607R, to thereby cause keyboard 103 to be attracted or repelled by the underside of display 102, as discussed in more detail below. Release mechanism 1602R, disposed on the right side of case 1601, has a symmetric counterpart on the left side.

In the presence magnet 1607R within keyboard 103, foot 1604 protrudes from case 1601 against the force of spring 1605. In that way, foot 1604 inserts into recess 1606 and locks keyboard 103 in the X and Y directions. When keyboard 103 is removed, the absence of magnet 1607R near foot 1604 allows spring 1605 to retract foot 1604 back into case 1601.

FIGS. 17A-C, 18A, and 18B illustrate the operation of a system for deploying a keyboard by misaligning magnets. Position 1700A shows an initial state of a right-side mechanism 1602R. When the mechanism is activated (e.g., via actuator 1501), an electrical current runs through shape memory alloy (SMA) actuator wire loop 1701, which then shortens or contracts the wire. Examples of suitable SMAs for implementing wire loop 1701 include, but are not limited to, MUSCLE WIRES and FLEXINOL.

Wire loop 1701 pulls pulley 1706 and causes arm 1705 to rotate around pivot point 1707. At point 1708, arm 1705 is connected to magnet 1603. The magnet 1603 has its movement restricted in the Y direction by foot 1604, and in Z direction by bracket 1702. Foot 1604 forms a hollow, rectangular channel, within which magnet 1603 can slide to the left and to the right.

Once arm 1705 reaches configuration 1700B, it flicks internal switch 1709, which stops the electrical current originally applied to wire 1701 via actuator 1501, and in response wire 1701 stops heating up and contracting. As wire 1701 cools down it extends, and tension spring 1710 pulls arm 17011 back to position 1700A. The left-side counterpart 1602L of mechanism 1602R is symmetrically disposed with respect thereto, as shown in view 1700C.

In position 1800A, the poles of magnets 1603L/R within display 102 are aligned with respect to the poles magnets 1607L/R on keyboard 103 for attaching the keyboard. The distance between poles in this configuration is 1708. When wire 1701 is fully shortened, point 1703 travels over distance 1708 and misaligns the poles, which causes magnet 1603L to push 1607L away, and it also causes magnet 1603R to push 1607R away. This releases keyboard 103 from the underside of display 102.

Figure 19:
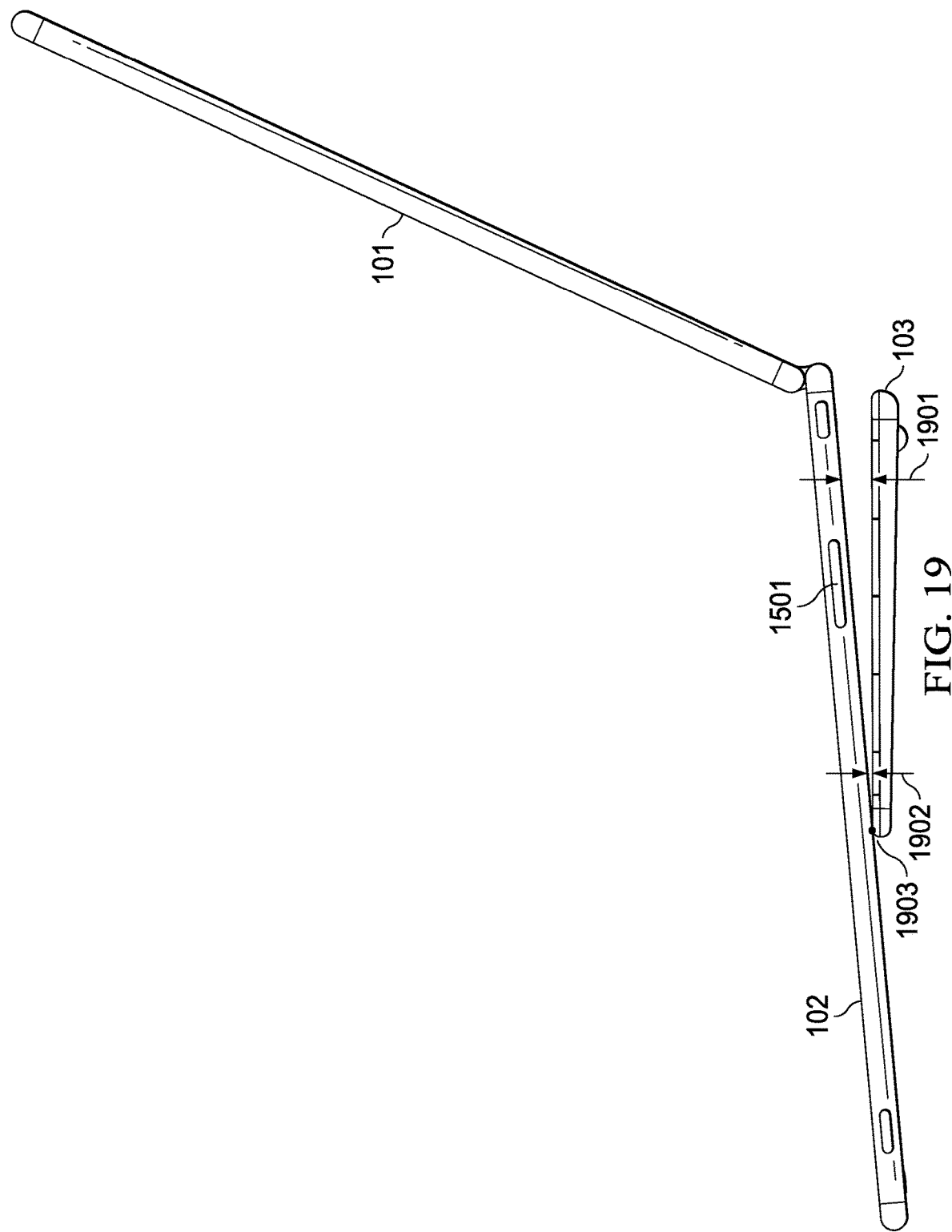
FIG. 19 illustrates a keyboard deployment operation, according to some embodiments.

FIG. 19 illustrates a keyboard deployment operation. When magnets 1603L/R and magnets 1607L/R are misaligned, as in position 1700B above, magnetic forces 1901 at foot 1604 push keyboard 103 away from display 102. However, magnetic forces 1902 between magnets 1609 and 1610 continues to attract them near that point. As keyboard 103 starts rotating around its bottom edge 1903, it creates a distance between magnets 1609 and 1610 at the spacebar. At some point, magnetic forces 1902 at the spacebar drop below the level where they can hold the weight of keyboard 103, and the keyboard drops.

Figure 20A:
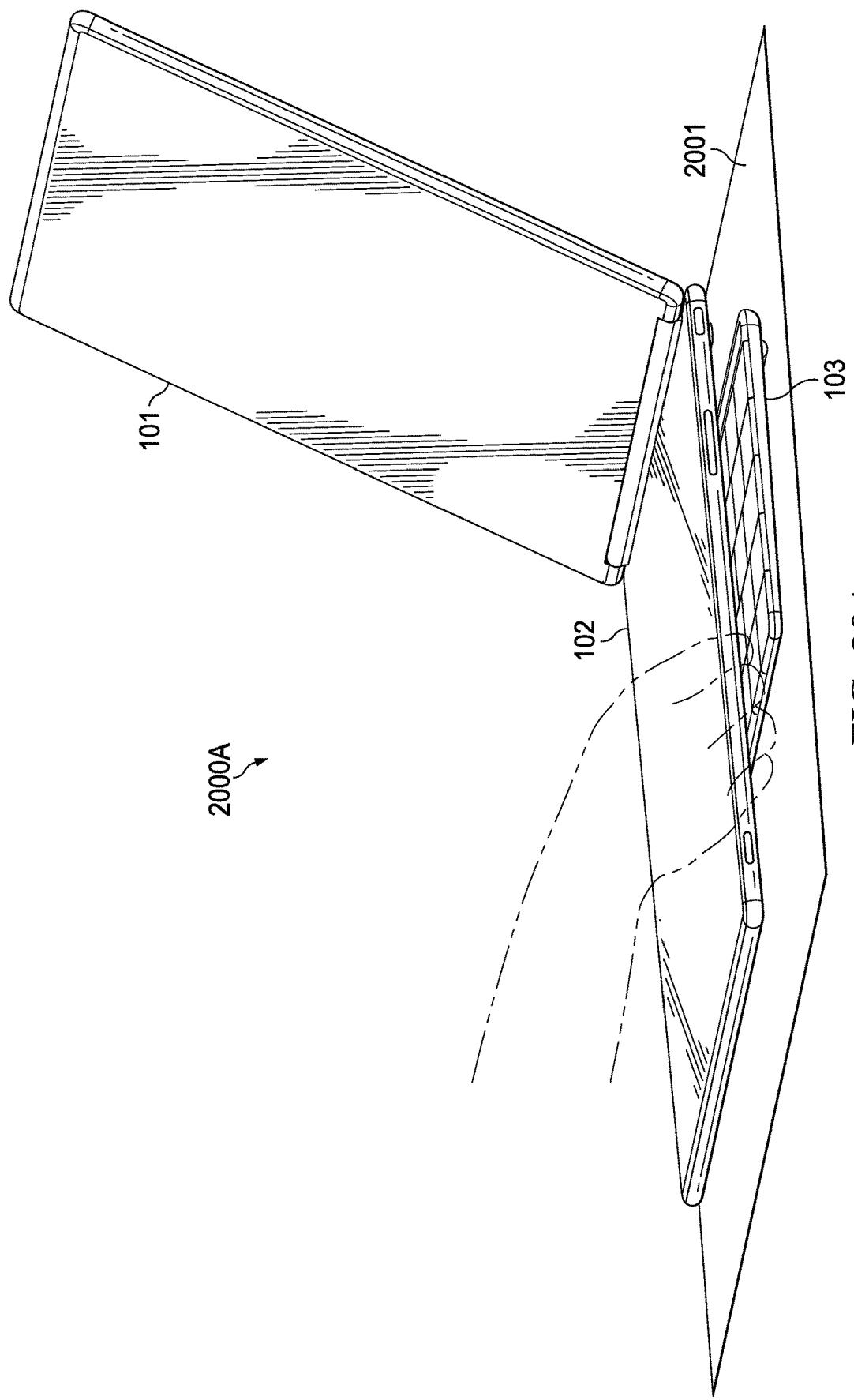
Figure 20C:
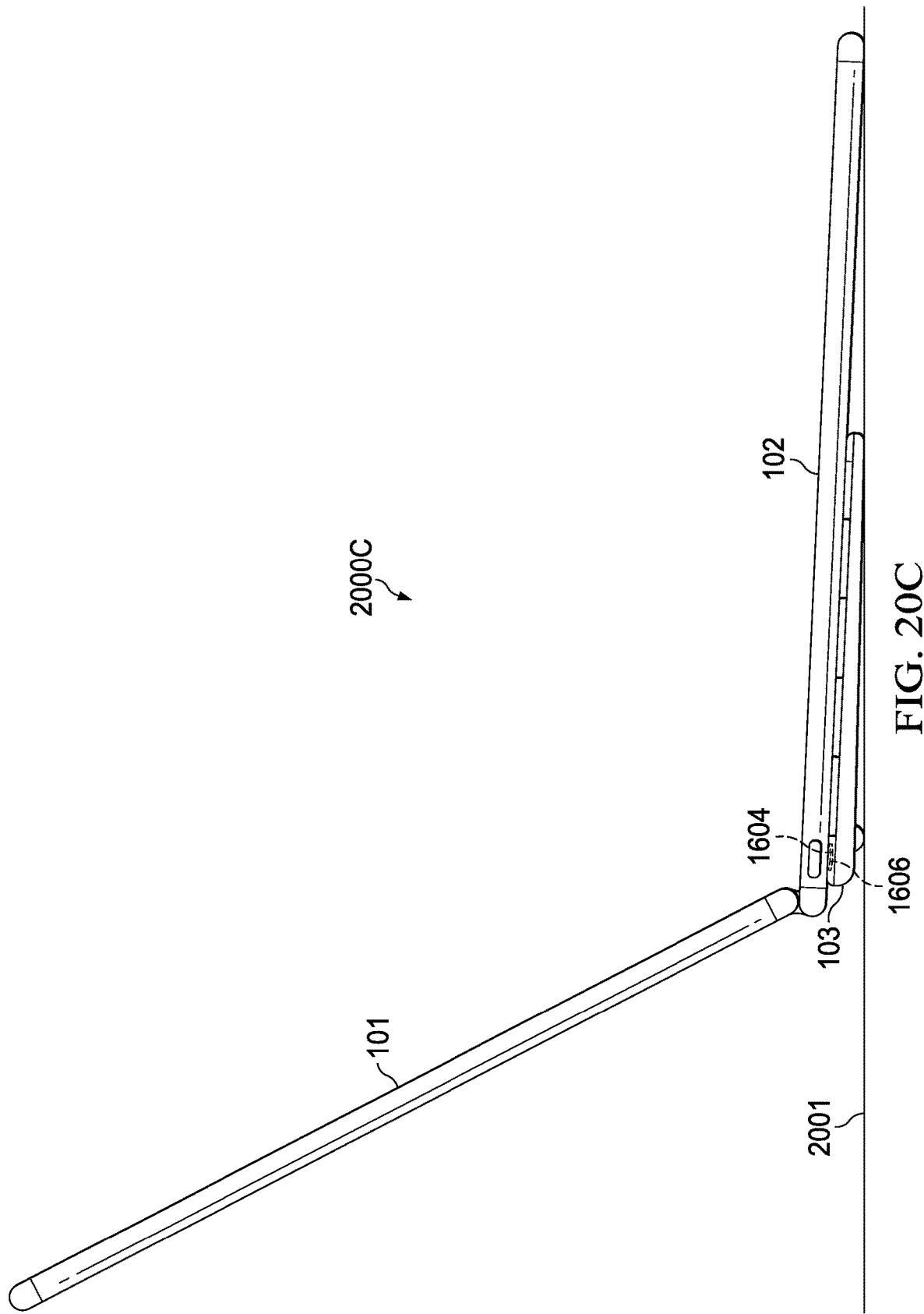

FIGS. 20A-C illustrate a keyboard attachment operation. To attach keyboard 103 to the back of display 102, the user places IHS 100 over keyboard 103 on a flat, horizontal surface 2001 (e.g., a table), as shown in position 2000A. When magnets 1603L/R and magnets 1607L/R are aligned, foot 1604 jumps out of display 102 and into keyboard 103. Now with foot 1604 sunk into well or recess 1606 of keyboard 103, display 102 and keyboard 103 no longer move relative to each other in the X and Y directions.

Figure 21A:
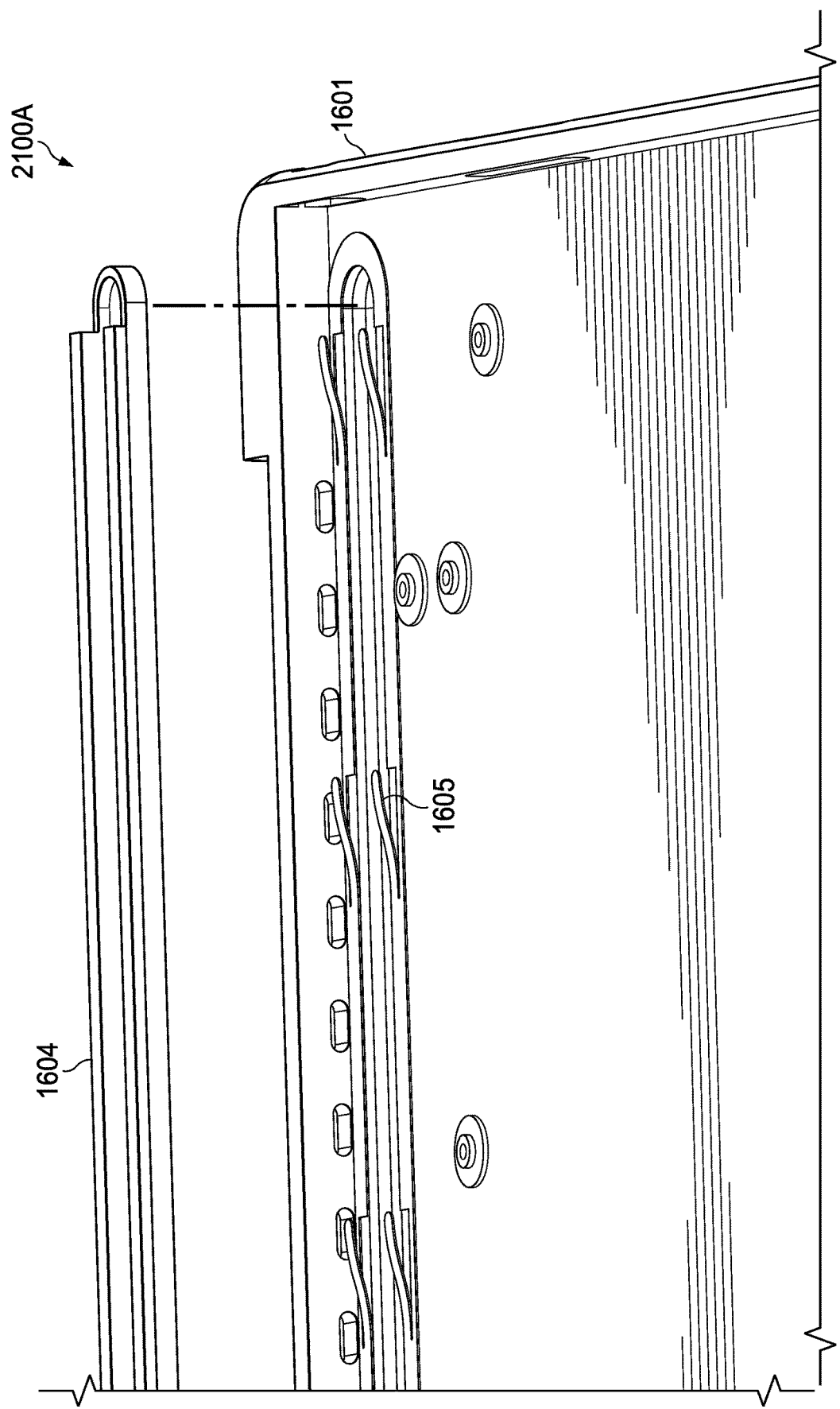
FIGS. 21A-C illustrate a retractable foot, according to some embodiments.
Figure 21B:
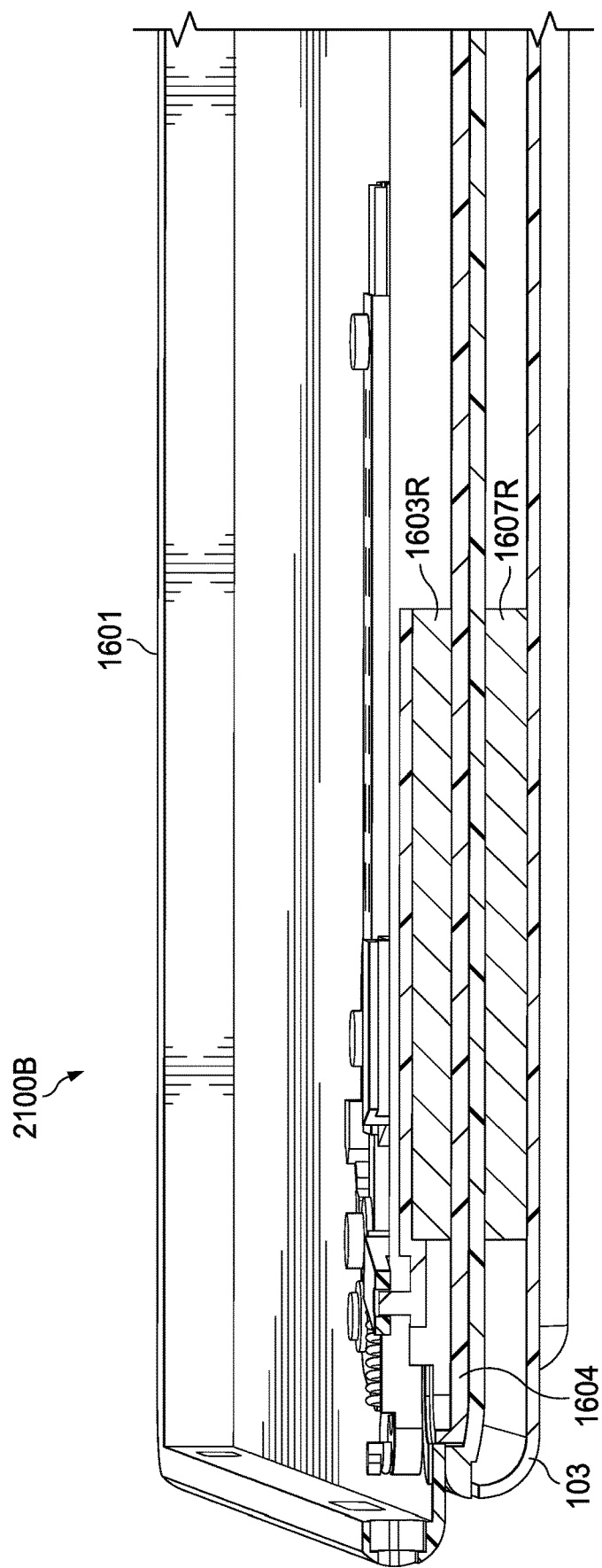
Figure 21C:
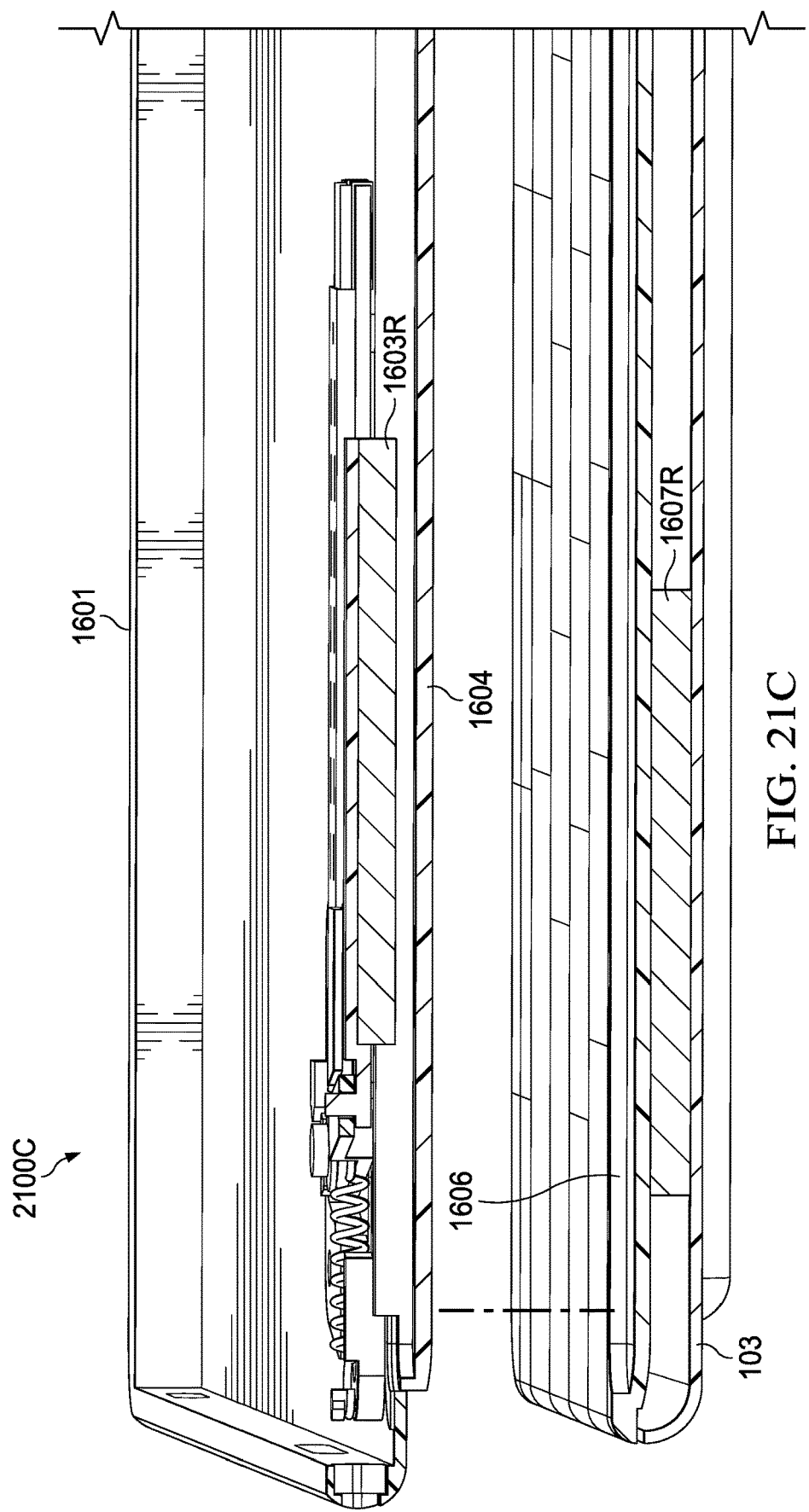

FIGS. 21A-C illustrate the operation of a retractable foot. Particularly, in exploded view 2100A, foot 1604 is shown, as well as spring-loaded base 1605. Foot 1604 sits on spring-loaded base 1605 when assembled, and it is pushed upwards by the spring action. In view 2100B, keyboard 103 is attached to the underside of case 1601 of display 102, such that magnets 1603R and 1607R are aligned to produce an attractive magnetic force. In this position, keyboard magnets 1607L and 1607R pull foot 1604 against spring-loaded base 1605 and into recess 1606. In position 2100C, the distance between keyboard 103 and display 102 is sufficiently large to allow spring-loaded base 1605 to retract foot 1604 back into case 1601.

Figure 22A:
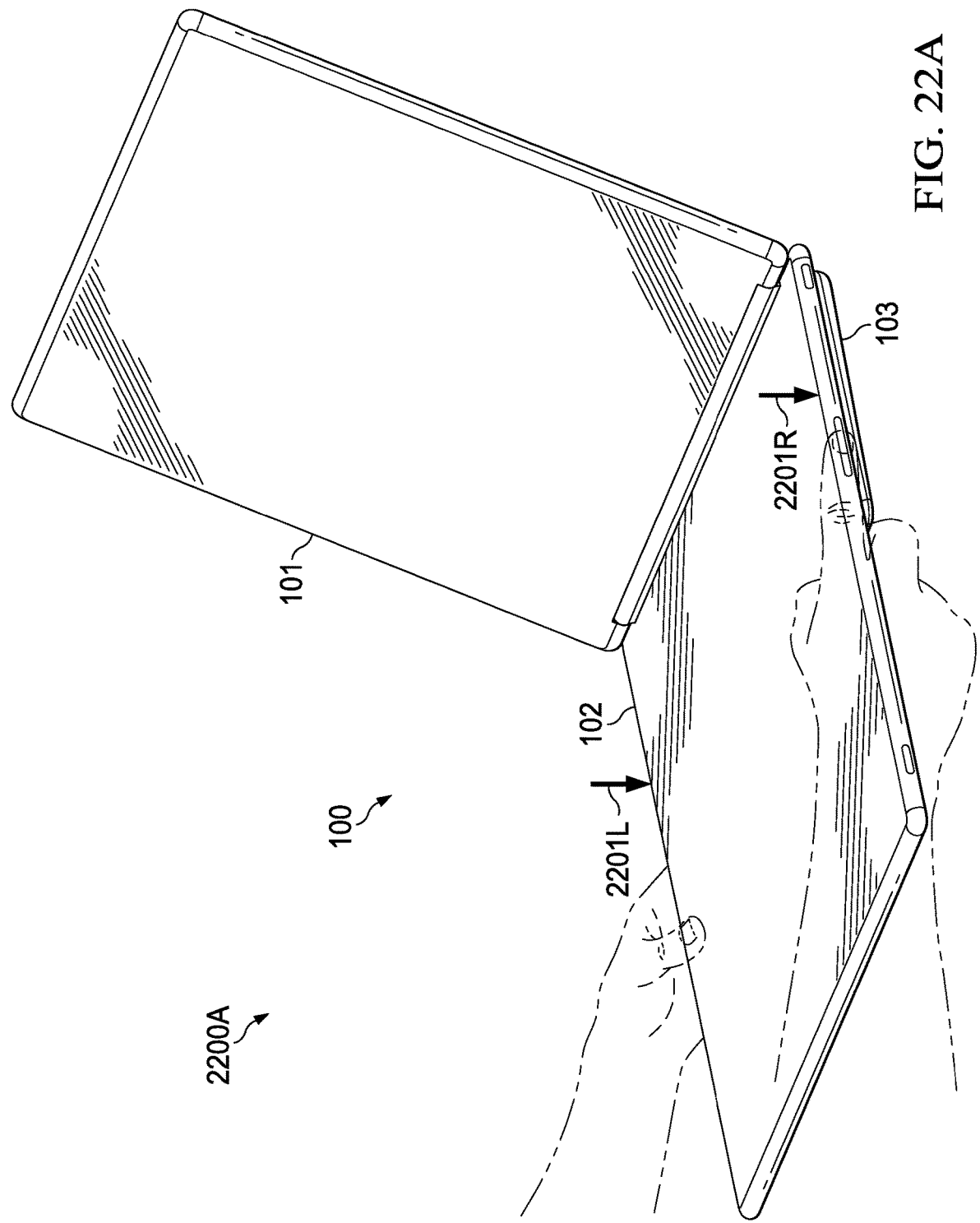
FIGS. 22A-C illustrate a method for deploying a keyboard with a mechanical wing system, according to some embodiments.
Figure 22B:
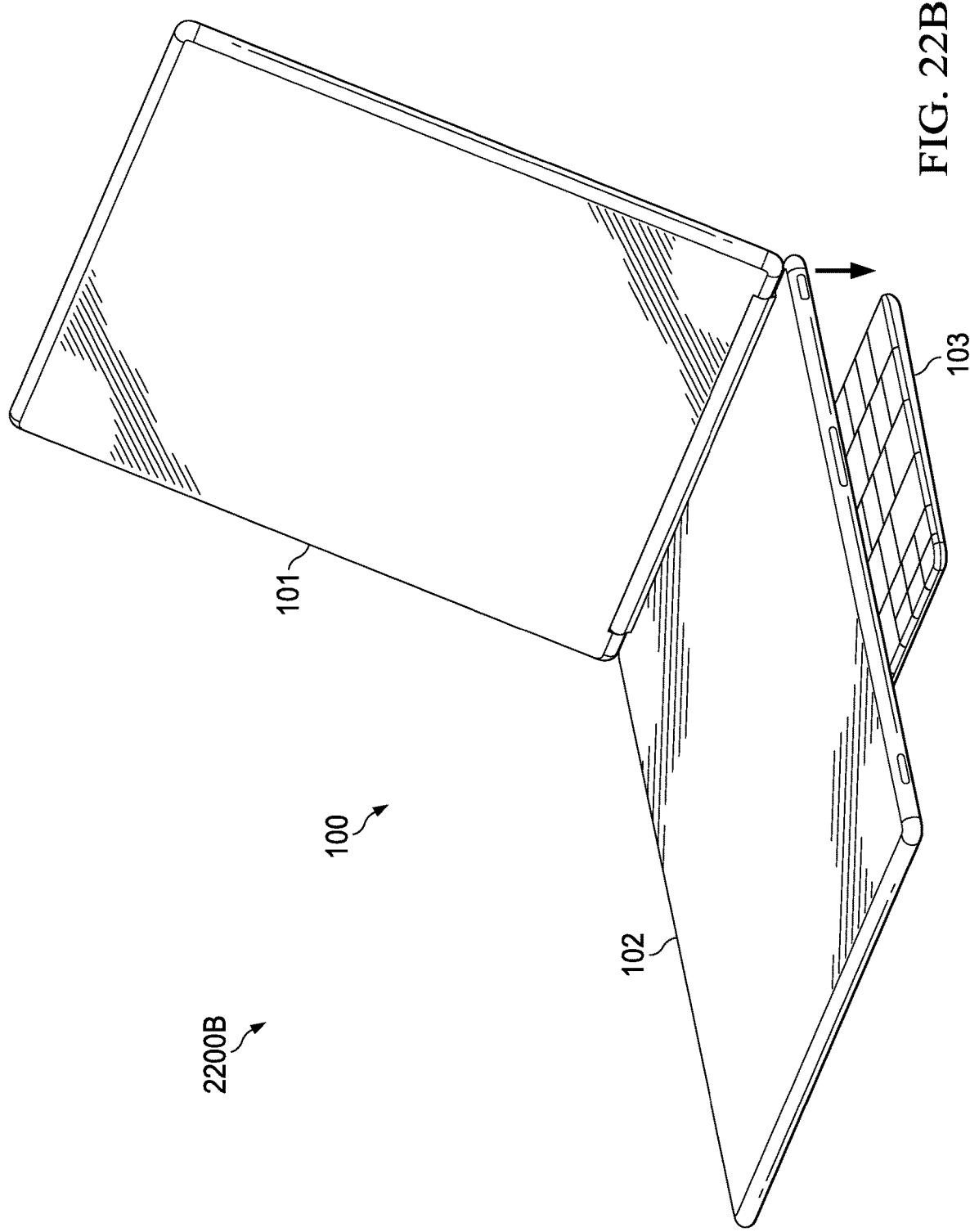
Figure 22C:
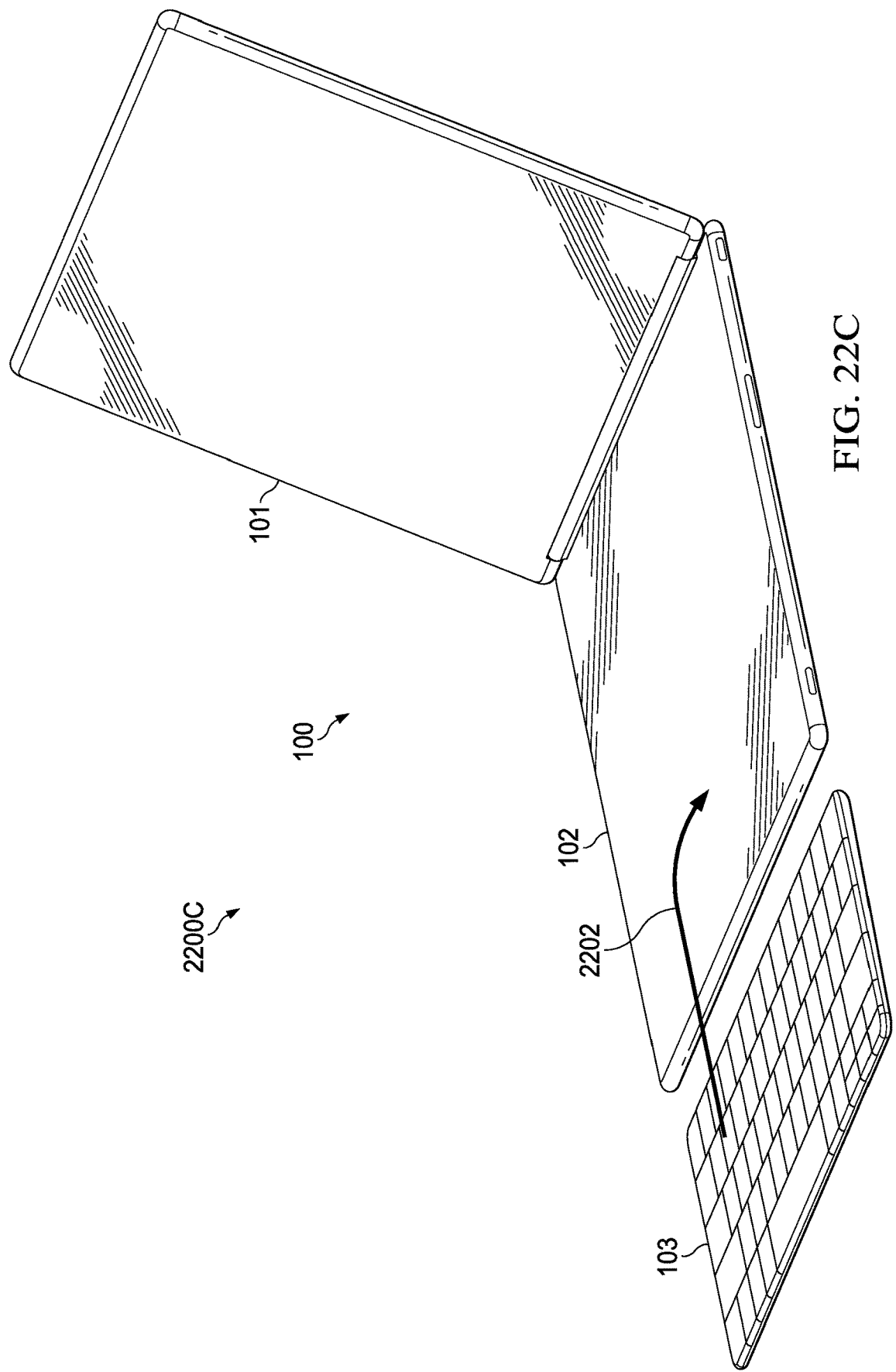

FIGS. 22A-C illustrate a method for deploying a keyboard with a mechanical wing system. In position 2200A, IHS 100 is in laptop mode with keyboard 103 coupled to the underside of display 102. In this case, a user has wings, clamps, or latches 2201L and 2202R available to deploy keyboard 103. The user picks up IHS 100 and pushes wings 2201L and 2202R downwards. In response, position 2200B shows keyboard 103 released from the underside of display 102 and laying on a flat surface under IHS 100. Then, in configuration 2200C, the user moves IHS 100 in direction 2202, to place it behind keyboard 103.

Figure 23:
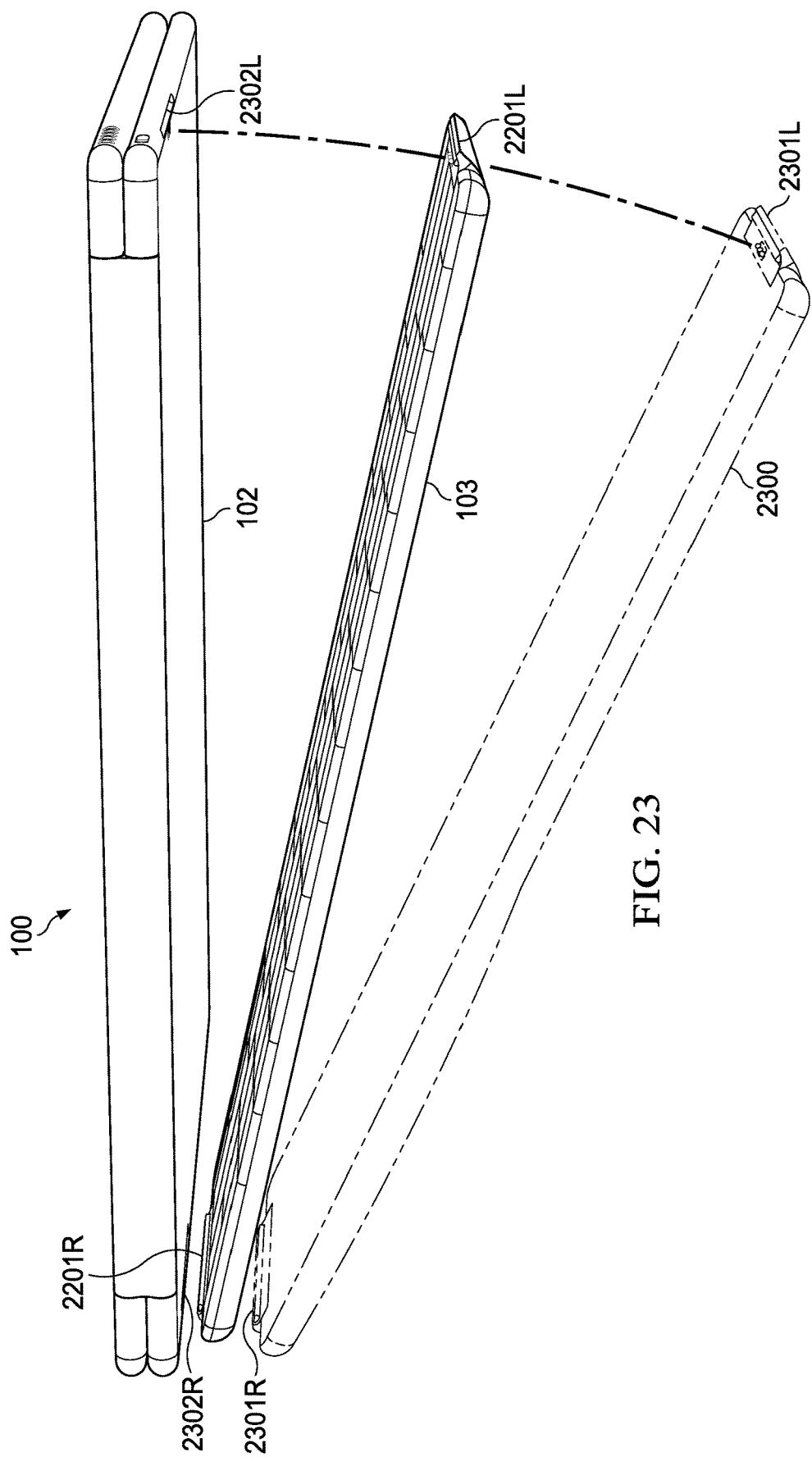
FIG. 23 illustrates a multi-form factor IHS with the mechanical wing system, according to some embodiments.

FIG. 23 illustrates a multi-form factor IHS with a mechanical wing system. In some embodiments, keyboard 103 includes wings 2201L and 2201R, which mechanically mate onto grooves 2302L and 2302R in display 102. When keyboard is not being used, battery accessory 2300 may be attached to the underside of display 102, for example, with wings 2301L and 2301R mating onto grooves 2302L and 2302R. In various embodiments, such a mechanical wing system may allow different accessories to be attached to, and put in communication with, IHS 100, via electrical connectors or terminals.

Figure 24A:
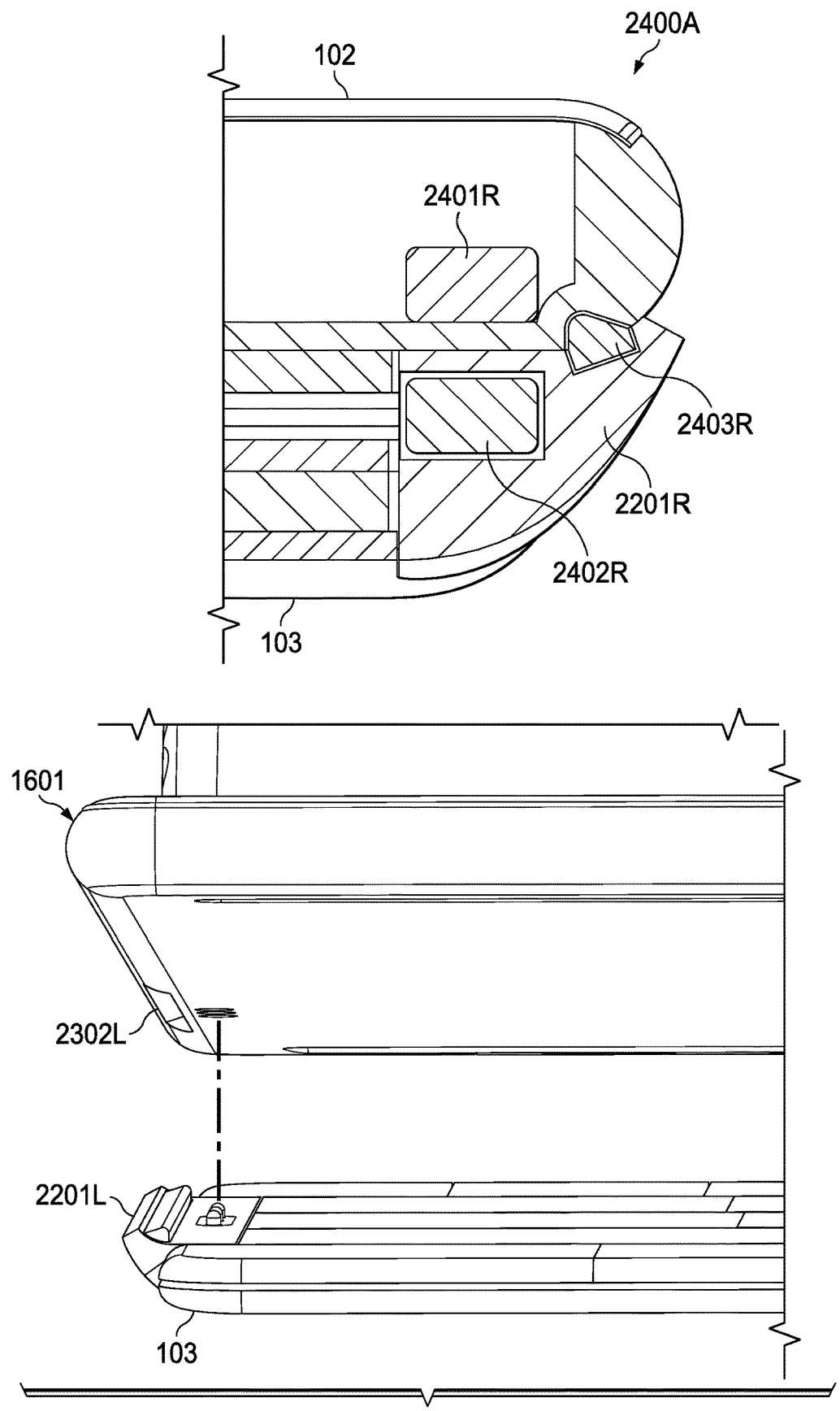

FIG. 24A and 24B illustrate components of a mechanical wing system. In embodiment 2400A, the release mechanism on the right side of IHS 100 comprises magnet 2401R disposed in display 102, and magnet 2402R disposed in the right wing 2201 R of keyboard 103. Magnets 2401 R and 2402R provide magnetic attachment forces in the Z direction. Right-side rib 2304R sticks into groove 2302R on the right side of case 1601, and it locks keyboard 103 in the X and Y directions. These components have symmetric counterparts on the left side, and together extension wings 2201L and 2201R can be pushed downward to release keyboard 103.

Shown in view 2400B, display 102 includes a pair of magnets 1401L (another pair of magnets 2401R is on the right side). Left-side wing 2201L houses rib 2403L, terminal or connector 2404, and magnets 2402L, as part of keyboard 103.

Figure 25:
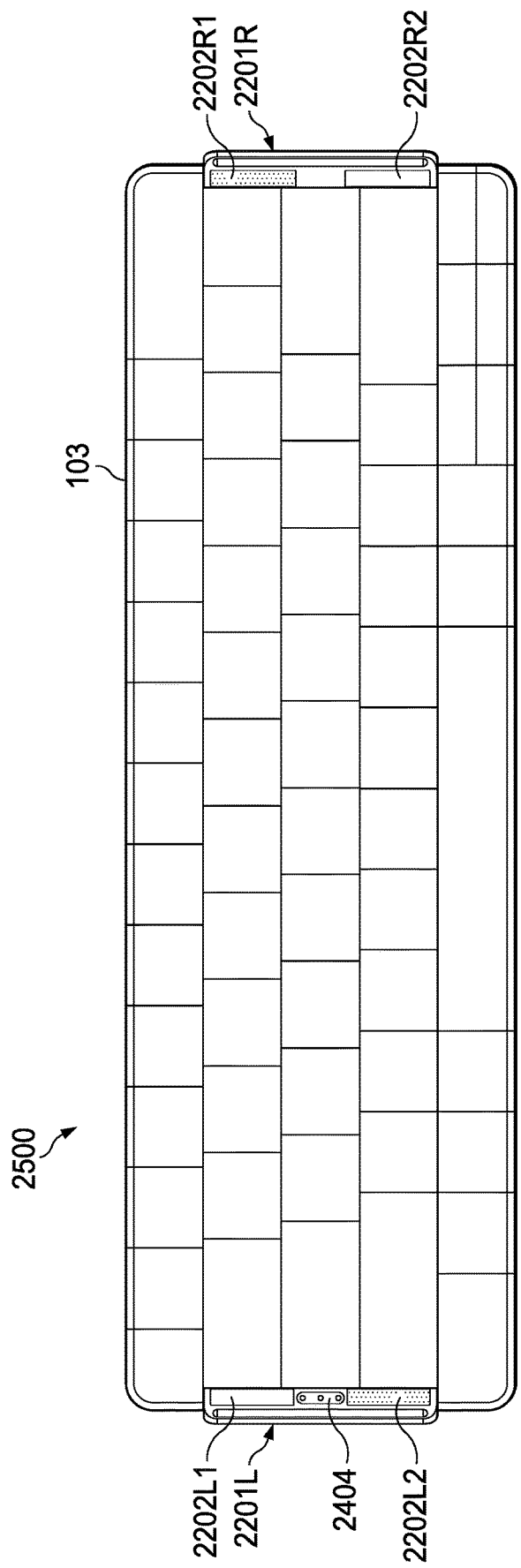
FIG. 25 illustrates a keyboard with a mechanical wing system, according to some embodiments.

FIG. 25 depicts keyboard 103 with a mechanical wing system. As shown, left-side wing 2201L holds magnets 2202L1 and 2202L2 with terminal 2404 in between them. Meanwhile, right-side wing 2201 R holds magnets 2202R1 and 2202R2. In some implementations, the pole of left-side magnet 2202L1 may be the same as the pole of right-side magnet 2202R2 (e.g., south) and it may be opposite to the pole of left-side magnet 2202L2 (e.g., north). Similarly, the pole of left-side magnet 2202L2 may be the same as the pole of right-side 2202R1 (e.g., north).

Corresponding magnets 2401R1/R2/L1/L2 on display 102 attract magnets 2201 R1/R2/L1/L2 on keyboard 103 when they are aligned and the keyboard is right-side-up; that is, the top edge of keyboard is closest to hinge 104. Because the poles of magnets 2201 R1/R2/L1/L2 are flipped, when the keyboard is upside-down (e.g., when bottom edge 1903 is closest to hinge 104), magnets 2201R1/R2/L1/L2 repel magnets 2201R1/R2/L1/L2, and keyboard 103 does not attach to the underside of display 102.

It should be understood that various operations described herein may be implemented in software executed by logic or processing circuitry, hardware, or a combination thereof.

The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method, comprising:
   engaging an actuator of an Information Handling System (IHS), wherein the IHS comprises a first display coupled to a second display via a hinge, wherein a keyboard is coupled to a backside of the second display, and wherein at least one of: (i) the actuator is a button on the second display and engaging the button causes an electrical current to be applied to a wire loop within the second display, or (ii) the actuator comprises a side wing having a rib coupled to a groove on the second display; and
   deploying the keyboard.

2. The method of claim 1, wherein when the keyboard is coupled to the backside of the second display, keycaps on the keyboard face the backside of the second display.

3. The method of claim 2, wherein deploying the keyboard further comprises dropping the keyboard on a flat surface underneath the second display.

4. The method of claim 3, further comprising positioning the IHS on the flat surface, behind the keyboard, in a laptop posture.

5. The method of claim 1, wherein a key on the keyboard comprises a first magnet and wherein the second display comprises a second magnet aligned with the first magnet when the keyboard is coupled to the backside of the second display.

6. The method of claim 5, wherein the key is a space bar.

7. The method of claim 1, wherein to deploy the keyboard, contraction of the wire loop due to the electrical current misaligns a first magnet disposed within the keyboard with respect to a second magnet disposed within the second display.

8. The method of claim 7, wherein misaligning the first magnet with respect to the second magnet further comprises swiveling a spring-loaded arm coupled to the second magnet.

9. The method of claim 7, wherein misaligning the first magnet with respect to the second magnet causes a spring-loaded foot that is magnetically coupled to the first magnet and mechanically coupled to a recess near a top edge of the keyboard to recede into the second display.

10. The method of claim 1, wherein the side wing further comprises a magnet configured to become magnetically coupled to a corresponding magnet in the second display.

11. An Information Handling System (IHS), comprising:
    a first display; and
    a second display coupled to the first display via a hinge, wherein the second display comprises an actuator configured to deploy a keyboard attached to an underside of the second display, and wherein a space bar on the keyboard comprises a first magnet and wherein the second display comprises a second magnet aligned with the first magnet when the keyboard is attached to the underside of the second display.

12. The IHS of claim 11, wherein the actuator is configured to cause an electrical current to be applied to a wire within the second display, and wherein to deploy the keyboard, contraction of the wire due to the electrical current misaligns a first magnet disposed within the keyboard with respect to a second magnet disposed within the second display by swiveling a spring-loaded arm coupled to the second magnet.

13. The IHS of claim 11, wherein the second display further comprises a spring-loaded foot magnetically coupled to the first magnet and mechanically coupled to a recess near a top edge of the keyboard.

14. The IHS of claim 11, wherein the actuator comprises a wing having a rib coupled to a groove on the second display, wherein the wing further comprises a magnet configured to become magnetically coupled to another magnet on the second display.

15. A device, comprising:
    a trigger mounted on a display; and
    a wire configured to contract in response to activation of the trigger, wherein the wire is
        coupled to a spring-loaded arm, and wherein the contraction translates a first
        magnet within the display with respect to a second magnet within a keyboard.

16. The device of claim 15, further comprising a spring-loaded foot that, in response to the keyboard being attached to the display, becomes magnetically coupled to the first magnet and mechanically coupled to the keyboard.

* * * * *